US011482997B2

(12) United States Patent
Sim et al.

(10) Patent No.: US 11,482,997 B2
(45) Date of Patent: Oct. 25, 2022

(54) BIDIRECTIONAL SEMICONDUCTOR CIRCUIT BREAKER

(71) Applicants: LS ELECTRIC CO., LTD., Anyang-si (KR); SEOUL NATIONAL UNIVERSITY R&DB FOUNDATION, Seoul (KR)

(72) Inventors: Jungwook Sim, Anyang-si (KR); Suhyeong Jang, Anyang-si (KR); Sunghee Kang, Anyang-si (KR); Woonghyeob Song, Anyang-si (KR); Seungki Sul, Seoul (KR); Donghoon Park, Suwon-Si (KR); Dongho Shin, Seoul (KR)

(73) Assignees: LS ELECTRIC CO., LTD., Anyang-si (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 17 days.

(21) Appl. No.: 17/268,307

(22) PCT Filed: Aug. 21, 2019

(86) PCT No.: PCT/KR2019/010622
§ 371 (c)(1),
(2) Date: Feb. 12, 2021

(87) PCT Pub. No.: WO2020/045889
PCT Pub. Date: Mar. 5, 2020

(65) Prior Publication Data
US 2021/0305980 A1 Sep. 30, 2021

(30) Foreign Application Priority Data

Aug. 27, 2018 (KR) .................. 10-2018-0100543
Apr. 11, 2019 (KR) .................. 10-2019-0042659

(51) Int. Cl.
*H03K 17/687* (2006.01)
*H02H 3/087* (2006.01)

(52) U.S. Cl.
CPC ......... *H03K 17/6871* (2013.01); *H02H 3/087* (2013.01)

(58) Field of Classification Search
CPC ... H02H 3/087; H01H 33/596; H03K 17/6871
See application file for complete search history.

(56) References Cited

U.S. PATENT DOCUMENTS

| 10,187,056 | B2 * | 1/2019 | Kang | H02H 3/087 |
| 11,289,892 | B2 * | 3/2022 | Ham | H02H 7/262 |

(Continued)

FOREIGN PATENT DOCUMENTS

| CN | 101355296 A | 1/2009 |
| JP | 2017-130391 A | 7/2017 |

(Continued)

OTHER PUBLICATIONS

International Search Report for related International Application No. PCT/KR2019/010622 dated Dec. 13, 2019.

(Continued)

*Primary Examiner* — Jared Fureman
*Assistant Examiner* — Christopher J Clark
(74) *Attorney, Agent, or Firm* — K&L Gates LLP

(57) ABSTRACT

The present disclosure relates to a bidirectional semiconductor circuit breaker including a primary circuit unit connected between a power supply and a load and in which a first semiconductor switch and a second semiconductor switch are arranged in series and a snubber circuit unit of which one end is connected to the front end of the first semiconductor switch and the other end is connected to the rear end of the second semiconductor switch, in parallel. The snubber circuit unit includes a first circuit line, a second (Continued)

circuit line, and a third circuit line of which one end and the other end are connected to the first circuit line and the second circuit line, respectively, and in which a first resistor and a second resistor are arranged in series, and provide a snubber circuit which is applicable to a bidirectional fault current and satisfies semiconductor protection and current restraining performance.

16 Claims, 15 Drawing Sheets

(56) References Cited

U.S. PATENT DOCUMENTS

| | | | | |
|---|---|---|---|---|
| 2003/0183838 | A1* | 10/2003 | Huang | H03K 17/08148 257/107 |
| 2003/0193770 | A1* | 10/2003 | Chung | H01H 9/542 361/118 |
| 2005/0180179 | A1* | 8/2005 | Hirst | H02M 5/293 363/21.07 |
| 2010/0277006 | A1* | 11/2010 | Urciuoli | H01L 29/8083 307/130 |
| 2011/0267132 | A1* | 11/2011 | Lubomirsky | H03K 17/08142 327/430 |
| 2014/0029152 | A1* | 1/2014 | Mazzola | H02H 3/087 361/115 |
| 2014/0034613 | A1* | 2/2014 | West | H01H 33/14 218/4 |
| 2014/0078622 | A1 | 3/2014 | Crane | |
| 2021/0305980 | A1* | 9/2021 | Sim | H02H 3/087 |

FOREIGN PATENT DOCUMENTS

| | | |
|---|---|---|
| KR | 10-0434153 B1 | 6/2004 |
| KR | 10-2011-0019000 A | 2/2011 |
| WO | WO-2021241871 A1 * | 12/2021 |

OTHER PUBLICATIONS

Search Report conducted by The Korean Institute of Patent Information of KR 10-2018-0100543 dated Nov. 9, 2018—4 Pages.

Urciuoli; "Evaluation of SiC VJFET Devices for Scalable Solid-State Circuit Breakers", Army Research Laboratory; Adelphi, MD 20783-1197, Sensors and Electron Devices Directorate, ARL, May 2008, 1-14 Pages.

* cited by examiner

---- POWER LINE CURRENT
——— CURRENT FLOWING TO R

---- POWER LINE CURRENT
—— CURRENT FLOWING TO R

---- POWER LINE CURRENT
—— CURRENT FLOWING TO R

----- POWER LINE CURRENT
——— CURRENT FLOWING TO R

- - - - POWER LINE CURRENT
——— CURRENT FLOWING TO R

- - - - POWER LINE CURRENT
——— CURRENT FLOWING TO R

BIDIRECTIONAL SEMICONDUCTOR CIRCUIT BREAKER

CROSS-REFERENCE TO RELATED APPLICATIONS

This application is the National Stage filing under 35 U.S.C. 371 of International Application No. PCT/KR2019/010622, filed on Aug. 21, 2019, which claims the benefit of earlier filing date and right of priority to Korean Application No. 10-2018-0100543 filed on Aug. 27, 2018 and Korean Application No. 10-2019-0042659 filed on Apr. 11, 2019, the contents of which are all hereby incorporated by reference herein in their entirety.

TECHNICAL FIELD

The present disclosure relates to a circuit breaker, and more particularly, a bidirectional semiconductor circuit breaker.

BACKGROUND

As for a semiconductor circuit breaker, a snubber circuit is generally used to protect a semiconductor device from damage caused by a voltage generated when switched on or off. A power semiconductor circuit breaker also requires the use of a snubber circuit to reduce a voltage generated in switching transition.

Examples of snubber circuits may include a capacitor (C) snubber circuit, a resistor-capacitor (RC) snubber circuit, a charge-discharge type resistor-capacitor-diode (RCD) snubber circuit, and a discharge-suppressing type snubber circuit.

Among them, the charge-discharge type RCD snubber works as follows.

In the case of a snubber consisting of a capacitor C connected in parallel with a power semiconductor device, an inrush current is caused by the power semiconductor device of a circuit breaker when it is turned on again after a fault current is removed. In detail, after a fault is detected, the capacitor C of the snubber is charged with a DC link voltage (V DC). Accordingly, when the circuit breaker is turned on again, a capacitor voltage is directly discharged through the power semiconductor device, causing an inrush current. In order to reduce the inrush current in the power semiconductor device and the capacitor, a discharge rate of the capacitor should be reduced, which can be achieved by connecting a resistor to the capacitor in series. Therefore, snubbers are usually configured as RC snubbers. Such a RC snubber can solve an inrush current during switching transition and quickly reduce a fault current. However, after the fault current is removed, an amount of voltage drop at both ends of the resistor becomes equal to an amount of voltage drop at both ends of the semiconductor device connected in parallel therewith, causing circuit damage or destruction due to an overvoltage caused by an increase in voltage.

Thus, a charge-discharge type RCD snubber 8 having a circuit structure of FIG. 1 is usually used in a semiconductor circuit breaker 10. Referring to FIG. 1, when the semiconductor circuit breaker 10, which is disposed between a power supply 1 and a load 2 interrupts a fault current, the charge-discharge RCD snubber 8 is operated as a C snubber until the fault current becomes zero (0), and is operated as an RC snubber when the semiconductor circuit breaker 10 is turned on again after the fault current is removed. However, even in the case of the charge-discharge type RCD snubber 8, a fault current cannot be immediately reduced in trip operation, since a voltage of the capacitor is not formed in the event of fault occurrence. In other words, the capacitor should be charged greater than or equal to Vdc in order to instantly interrupt the fault current.

In the case of the discharge-suppressing type snubber, as shown in FIG. 2, a semiconductor circuit breaker 10' equipped with a discharge-suppressing type snubber 8' has an output voltage that starts from Vdc, and thus a fault current can be interrupted immediately right after a turn-off process of the circuit breaker. That is, since a capacitor C of the snubber 8' is charged with Vdc in normal conditions (or state), a flow of the fault current can be interrupted. In a system in which line inductance varies depending on a point of fault occurrence, the semiconductor circuit breaker 10' having the snubber 8' can suppress an increase in fault current immediately when fault conditions occur, owing to a pre-charged capacitor.

In addition, as illustrated in FIG. 2, since there in a freewheeling path in a snubber circuit, overvoltage protection of the semiconductor circuit breaker 10' can be achieved without a freewheeling diode. Therefore, the discharge-suppressing type RCD snubber exhibits improved overvoltage protection and fault current interruption performance than the charge-discharge type RCD snubber. However, when interrupting a reverse fault current, overvoltage is generated at both ends of the semiconductor circuit breaker 10' since a diode of the discharge-suppressing type RCD snubber blocks a current path. Therefore, the discharge-suppressing type RCD snubber is not suitable for a bidirectional snubber circuit of a bidirectional semiconductor circuit breaker.

As such, a snubber circuit employed in the conventional semiconductor circuit breaker does not satisfy all cases of quick fault current interruption, excellent overvoltage protection, and bidirectional operation capability. That is, a snubber circuit that emphasizes semiconductor protection and current interruption performance is only suitable for unidirectional fault current interruption, and a snubber circuit capable of interrupting a bidirectional fault current is not satisfactory enough in terms of semiconductor protection and current interruption performance.

SUMMARY

Therefore, in order to solve the aforementioned problems, the present disclosure describes a bidirectional semiconductor circuit breaker having a snubber circuit that can interrupt bidirectional fault current while providing semiconductor protection and current suppression capability.

According to one aspect of the subject matter described in this application, a bidirectional semiconductor circuit breaker includes: a main circuit unit connected between a power supply and a load, and having first and second semiconductor switches arranged in series; and a snubber circuit unit having one end connected in parallel with a front end of the first semiconductor switch and another end connected in parallel with a rear end of the second semiconductor switch. The snubber circuit unit may include: a first circuit line in which a first capacitor and a first diode are arranged in series; a second circuit line connected in parallel with the first circuit line, and in which a second capacitor and a second diode are arranged in series; and a third circuit line having one end connected to the first circuit line and another end connected to the second circuit line, and in which a first resistor and a second resistor are arranged in series.

Implementations according to this aspect may include one or more of the following features. For example, the circuit breaker may further include a first freewheeling circuit that is provided at an input portion of the circuit breaker to be made up of a third diode and a third resistor, and suppresses an overvoltage generated during trip operation. The first freewheeling circuit may include the third diode connected in parallel with the power supply at a power supply node of the first semiconductor switch, and the third resistor connected in parallel between the third diode and ground.

In some implementations, the circuit breaker may further include a second freewheeling circuit that is provided at an output portion of the circuit breaker to be made up of a fourth diode and a fourth resistor. The second freewheeling circuit may include the fourth diode connected in parallel with the load at a load node of the second semiconductor switch, and the fourth resistor fourth resistor connected in parallel between the fourth diode and ground.

In some implementations, the power supply may include an inductor component, and the load includes an inductor component.

In some implementations, a voltage of the first capacitor of the snubber circuit may be maintained the same as a voltage of the power supply before a time point $t_1$ at which a short circuit event occurs so that a fault current flowing in a power supply node or a load node does not increase further from a time point $t_2$ at which the first and second semiconductor switches are turned off.

In some implementations, the first and second semiconductor switches are turned off by receiving a turn-off signal from a current sensor at the time point $t_2$ when current flowing in the first and second semiconductor switches reaches a protection level after the time point $t_1$ of the short circuit occurrence.

In some implementations, a fault current $I_{fw}$ starts to flow at the time point $t_2$ through the second freewheeling circuit. Current flowing from the first inductor through the first circuit line of the snubber circuit unit may become zero at a time point $t_3$ after the time point $t_2$. In addition, the fault current $I_{fw}$ may increase to the time point $t_3$ and then decrease from the time point $t_3$.

In some implementations, the first semiconductor switch is configured such that a first metal-oxide-semiconductor field effect transistor (MOSFET) and a first parallel diode are connected in parallel. Also, the second semiconductor switch may be configured such that a second MOSFET and a second parallel diode are connected in parallel. The first MOSFET and the second MOSFET may be N-channel MOSFETs. Here, one end and the other end of the first parallel diode may be connected to a source and a drain of the first MOSFET, respectively. In addition, one end and the other end of the second parallel diode may be connected to a drain and a source of the second MOSFET, respectively.

In some implementations, the first circuit line may be connected in series in the order of the first capacitor and the first diode, and the second circuit line may be connected in series in the order of the second diode and the second capacitor.

In some implementations, one end of the third circuit line may be connected to the other end of the first capacitor and one end of the first diode, and the other end of the third circuit line may be connected to one end of the second diode and the other end of the second capacitor.

In some implementations, the first resistor and the second resistor may be connected to a ground point therebetween, and the snubber circuit unit may be point symmetric with respect to the ground point.

In some implementations, the first resistor and the second resistor may cause an increase in voltage drop generated when a fault current flows into the snubber circuit unit. In addition, the ground point, which is a ground path through which the fault current flows, may be provided at a connection point between the first resistor and the second resistor.

In some implementations, one end of the first resistor may be connected to a connection point between the first capacitor and the first diode, and the other end of the first resistor may be connected to a connection point between the second capacitor and the second diode. In addition, one end of the second resistor may be connected in series with the first resistor at the connection point between the second capacitor and the second diode, and the other end of the second resistor may be connected to a ground point.

In some implementations, the first resistor and the second resistor may be configured as non-linear resistor elements, and be connected in series with each other.

In some implementations, the circuit breaker may have a circuit structure in which a mechanical switch is connected in series with the circuit breaker to left and right contacts or one contact, so as to provide physical insulation and overvoltage protection after interruption is completed. Accordingly, the mechanical switch, after the first and second semiconductor switches are turned off, may be opened through a separate signal or a time delay to maintain physical insulation of the circuit breaker.

In some implementations, a metal oxide varistor (MOV) arranged in parallel with the first and second semiconductor switches may be further provided, so as to suppress an overvoltage. The MOV may be configured to dump current flowing in the first and second semiconductor switches to another path when a voltage applied to the first and second semiconductor switches is greater than or equal to a predetermined voltage.

The bidirectional semiconductor circuit breaker according to the present disclosure is a bidirectional semiconductor circuit breaker including a snubber circuit that can provide semiconductor protection and current suppression, and be used for interrupting bidirectional fault current. Accordingly, a semiconductor circuit breaker or a semiconductor module of a switch may be installed in an easier manner. Also, the design of a semiconductor circuit breaker having high performance and reliability may be accomplished.

More specifically, semiconductor protection from overvoltage may be achieved through a structure (or configuration) of the snubber circuit according to the present disclosure, and resistor (R), capacitor (C), and diode (D) designs in the snubber circuit. Quick fault current interruption may be achieved through the resistor R design in the snubber circuit according to the disclosure. In addition, bidirectional operability against bidirectional fault current may be achieved through symmetry when disposing electrical devices (or elements) inside the snubber circuit according to the present disclosure.

When fault conditions occur at the power supply side of the circuit breaker, the freewheeling circuit connected in parallel to the load side of the circuit breaker may allow a fault current to be interrupted and charging energy to be exhausted. In addition, the mechanical switch may be opened through a separate signal or a time delay after the semiconductor switches are turned off.

Further, the bi-directional semiconductor circuit breaker according to the present disclosure may also be implemented as an asymmetrical snubber circuit, and thus current flowing to the power supply side does not increase beyond a target current interruption level even in a condition having a low power inductance when fault conditions occur.

DETAILED DESCRIPTION

Description will now be given in detail of a configuration for achieving the aforementioned aspects of the present disclosure and its effects according to one or more implementations of the present disclosure, with reference to the accompanying drawings.

Herein, a 'front end' and a 'rear end' of a specific constituting element (or component) is based on a current flow direction in normal conditions. For example, when a circuit breaker is installed between positive and negative poles of a power supply, current flows in the order of 'the positive pole of the power supply—a front end of the circuit breaker—the circuit breaker—a rear end of the circuit breaker—the negative pole of the power supply'.

A bidirectional DC system requires a circuit breaker with bidirectional interruption capability. Thus, when a solid-state circuit breaker (SSCB) is employed, a snubber with bidirectional operation capability is required to interrupt a fault current in a stable manner. There may be two application cases of the snubber circuit.

Figure 1:
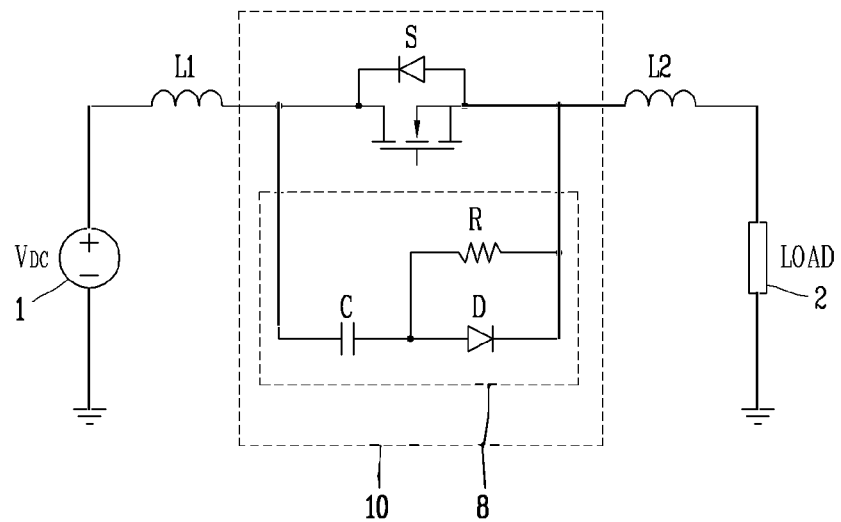
FIG. 1 is an exemplary circuit diagram of a semiconductor circuit breaker to which the conventional charge-discharge type RCD snubber is applied.
Figure 2:
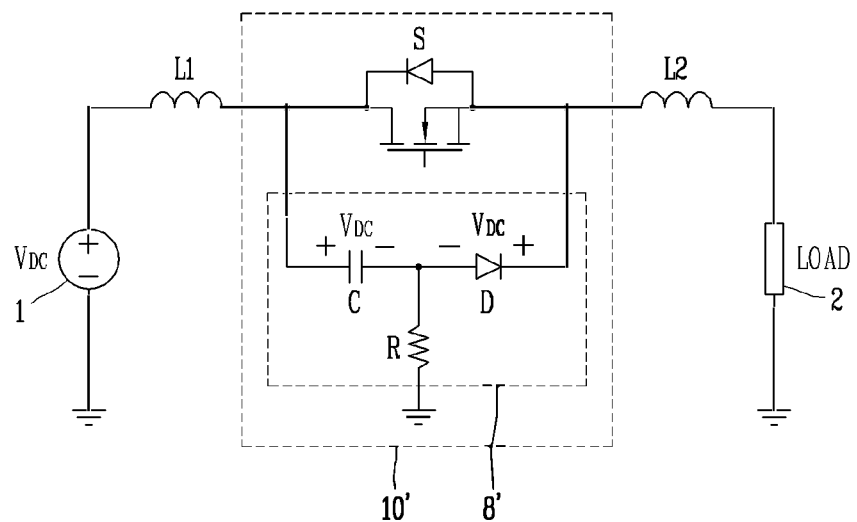
FIG. 2 is an exemplary circuit diagram of a semiconductor circuit breaker to which the conventional discharge-suppressing type RCD snubber is applied.
Figure 3:
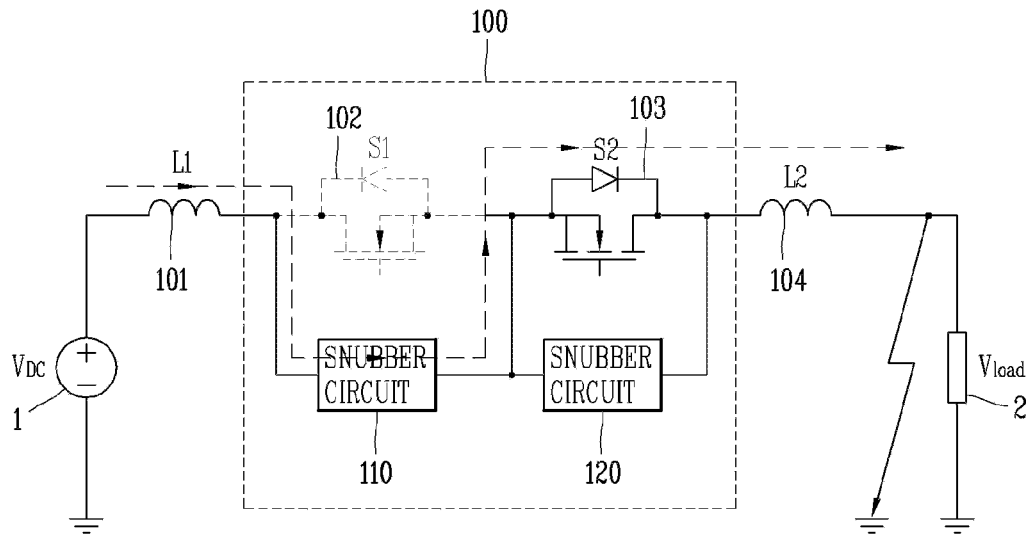
FIG. 3 illustrates an example in which two snubber circuits are applied to enable bidirectional operation.
Figure 4:
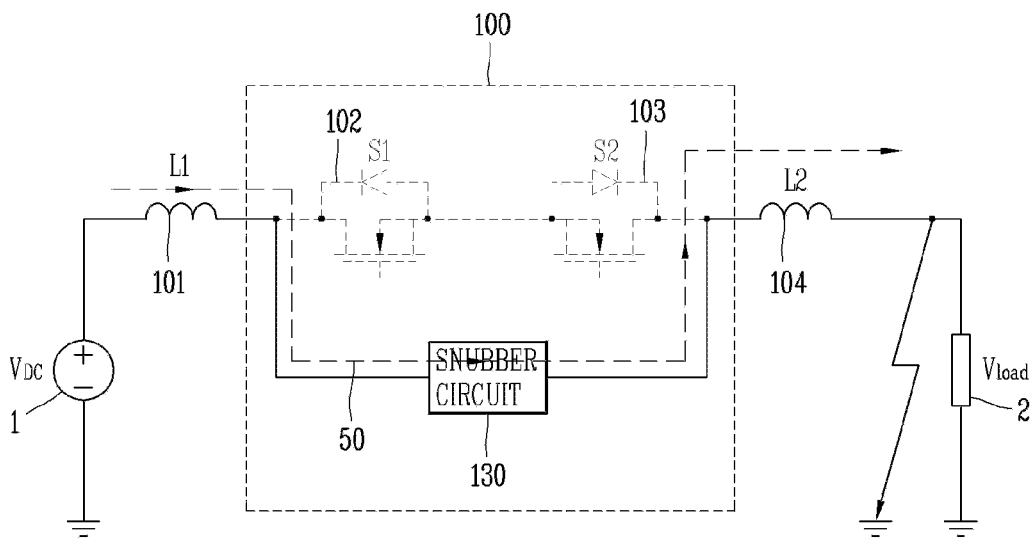
FIG. 4 illustrates an example in which a snubber circuit with high performance capable of bidirectional operation is applied.

The first one is to apply two unidirectional snubber circuits 110 and 120 to enable bidirectional operation as shown in FIG. 3, and the second one is to apply a snubber circuit 130 with high performance capable of bidirectional operation as shown in FIG. 4. Here, in each of the snubber circuits, a first reactor 101 at a rear end of a power supply 1 represents (the amount of) inductance generated by the power supply 1, and a second reactor 104 at a front end of a load 2 represents (the amount of) inductance generated by the load 2.

First, referring to FIG. 3, a fault current may be interrupted by simultaneously turning off two semiconductor switches 102 and 103 of the SSCB with one gate signal. Accordingly, as shown in FIG. 3, the fault current flows through a parallel diode of the second semiconductor switch 103 until current reaches 0A. Here, a reverse current may be conducted in an upper limit region of a metal-oxide-semiconductor field effect transistor (MOSFET). Thus, in the case of a SiC MOSFET with no external anti-parallel diode, a body diode of the MOSFET having a high conduction voltage is subjected to thermal stress due to an increase in conduction loss. Therefore, in order to increase the overall reliability and durability of the SSCB based on the SiC MOSFET having no anti-parallel diode, a snubber circuit with a different configuration may be desirable.

Figure 5:
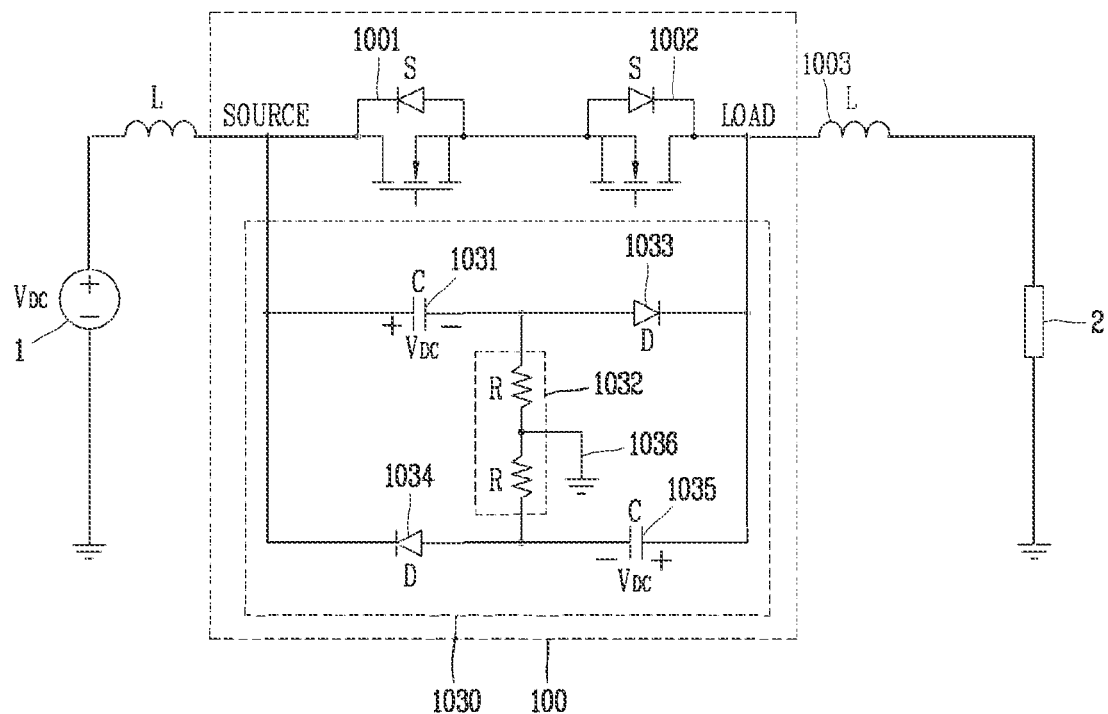
FIG. 5 is a diagram illustrating a circuit of a bidirectional circuit breaker that includes a snubber circuit capable of bidirectional operation designed according to an implementation of the present disclosure.

Meanwhile, as illustrated in FIG. 4, a fault current 50 flows to a snubber circuit 130 when a fault current is interrupted by one gate signal. Accordingly, the fault current does not flow through parallel diodes S1 and S2 of respective two SiC MOSFETs. As a result, thermal stress of the SiC MOSFETs may be greatly reduced using this bidirectional snubber circuit. FIG. 5 is a diagram illustrating a circuit of a bidirectional circuit breaker that includes a snubber circuit capable of bidirectional operation designed according to an implementation of the present disclosure.

Referring to FIG. 5, an entire (or whole) circuit 100 of a bidirectional circuit breaker includes a main circuit unit (or primary circuit unit) connected between a power supply 1 and a load 2. Here, the main circuit unit includes a first MOSFET switch (semiconductor switch) 1001 and a second MOSFET switch (semiconductor switch) 1002 connected in series. Meanwhile, a reactor 1003 that represents an inductance component generated by the load 2 may be considered. In normal conditions, current flows out of an anode of the power supply 1, through the load 2, and into a cathode of the power supply 1.

In addition, the bidirectional circuit breaker according to an implementation of the present disclosure includes a snubber circuit unit 1030 having one end connected in parallel with a front end of the first MOSFET switch 1001 and the other end connected in parallel with a rear end of the second MOSFET switch 1002. In consideration of directionality (or orientation) of the first and second MOSFET switches 1001 and 1002, one end and the other end of the snubber circuit unit 1030 may be referred to as a front end and a rear end, respectively. That is, the one end and the other end of the snubber circuit unit 1030 are connected to different end portions of the first and second MOSFET switches 1001 and 1002, respectively, namely, the front end of the first MOSFET switch 1001 and the rear end of the second MOSFET switch 1002.

Here, the first and second MOSFET switches 1001 and 1002 are configured such that a MOSFET device and a diode are connected in parallel. Here, the diode may be a switch that is turned on/off based on an applied voltage. Accordingly, the first and second MOSFET switches 1001 and 1002 are configured such that a MOSFET device and a switching device are connected in parallel.

Meanwhile, the snubber circuit unit 1030 may include a plurality of circuit lines. In detail, the snubber circuit unit 1030 includes a first circuit line in which a first capacitor 1031 and a first diode 1033 are arranged in series. The snubber circuit unit 1030 may further include a second circuit line connected in parallel with the first circuit line, and having a second capacitor 1035 and a second diode 1034 arranged in series. In addition, the snubber circuit unit 1030 may further include a third circuit line having one end connected in series with the first circuit line and the other end connected in series with the second circuit line, and having a plurality of resistors (first resistor and second resistor) 1032 arranged in series.

Meanwhile, the first diode 1033 is disposed in a direction toward the load 2 from the power supply 1, and the second diode 1034 is disposed in a direction toward the power supply 1 from the load 2. Hereinafter, for convenience of description, a front end of the first MOSFET switch 1001 will be referred to as a "source node", and a rear end of the second MOSFET switch 1002 will be referred to as a "load node".

The snubber circuit unit 1030 capable of bidirectional operation is provided between the source node and the load node. In the snubber circuit unit 1030, the first capacitor 1031 and the first diode 1033 connected in series (i.e., the first circuit line) and the second diode 1034 and the first capacitor 1035 connected in series (i.e., the second circuit line) are arranged in parallel. Accordingly, the capacitors and diodes of the first circuit line and the second circuit line are symmetrical.

The third circuit line including the plurality of resistors 1032 connected in series is formed between the first circuit line and the second circuit line. Here, one end of the third circuit line may be connected between a rear end of the first capacitor 1031 and a front end of the first diode 1033. The other end of the third circuit line may be connected between a rear end of the second diode 1034 and a front end of the second capacitor 1035.

The second capacitor 1035 of the second circuit line is charged in normal conditions, and is discharged when a fault current occurs in the load 2, which in turn generates a reverse current. Likewise, the first capacitor 1031 of the first circuit line is charged in normal conditions, and is discharged when a fault current occurs in the power supply 1, which in turn generates a reverse current.

In normal conditions, the capacitors 1031 and 1035 of the snubber circuit unit 1030 can remain on charge with Vdc, a fault current may be quickly reduced immediately when the semiconductor circuit breaker trips. In addition, as a ground path that allows the fault current to flow through the plurality of resistors 1032 is disposed in the snubber circuit unit 1030, the burden on the capacitors 1031 and 1035 is reduced during the fault current interruption process. In other words, it can be said that overvoltage protection performance of the MOSFET switch is enhanced.

More specifically, in the snubber circuit unit 1030, the capacitors 1031 and 1035 provide overvoltage protection for the MOSFET switch during the fault current interruption process. In addition, the resistors 1032 cause an increase in voltage drop due to a fault current flowing into the snubber circuit unit 1030. Accordingly, the fault current may be quickly reduced, and overvoltage protection for the MOSFET switch may be provided by forming the ground path that allows the fault current to flow. Further, the diodes 1033 and 1034 serve to suppress an unexpected overvoltage occurrence due to a voltage drop in the resistors.

FIGS. 6 to 9 are exemplary diagrams for explaining interruption operation when a short circuit event occurs at a load side in a bidirectional circuit breaker to which a snubber circuit according to an implementation of the present disclosure is applied.

A snubber circuit according to the present disclosure may be applied to both cases when a power supply 1 side inductance component and a load 2 side inductance component are symmetrical in size and asymmetrical in size with respect to a SSCB. Thus, it provides excellent voltage protection and fault current interruption performance for the both cases. In addition, since a circuit of the SSCB according to the present disclosure enables bidirectional operation, it may also be applied to a bidirectional circuit breaker.

In this regard, referring to FIGS. 6 to 9, the SSCB has a perfect point symmetric (or point reflection) structure with respect to a ground node between resistors. Therefore, even when positions of power/load are changed from each other, circuit operation may be performed in a symmetrical manner. Accordingly, the SSCB according to the present disclosure may be employed in a bidirectional circuit breaker.

Figure 6:
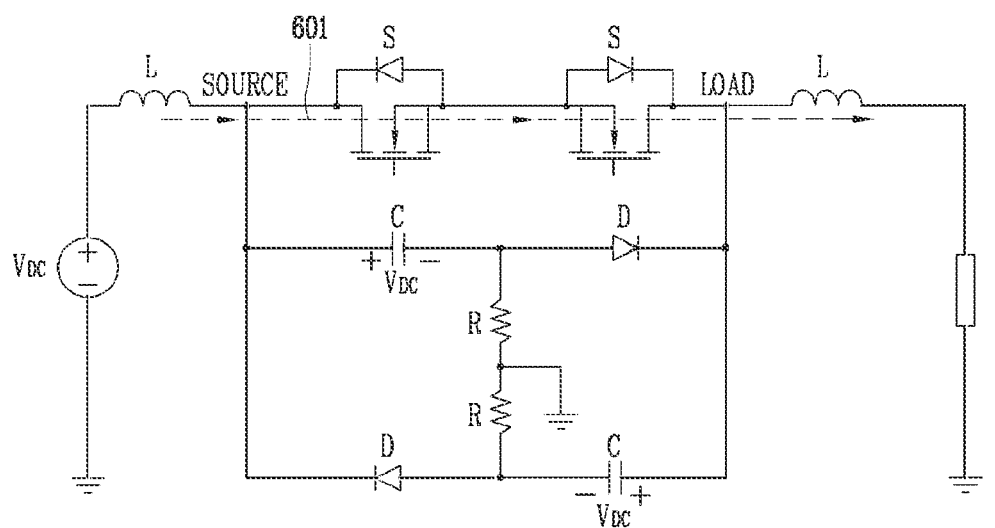
FIGS. 6 to 9 are exemplary diagrams for explaining interruption operation when a short circuit event occurs at a load side in a bidirectional circuit breaker to which a snubber circuit according to an implementation of the present disclosure is applied.
Figure 7:
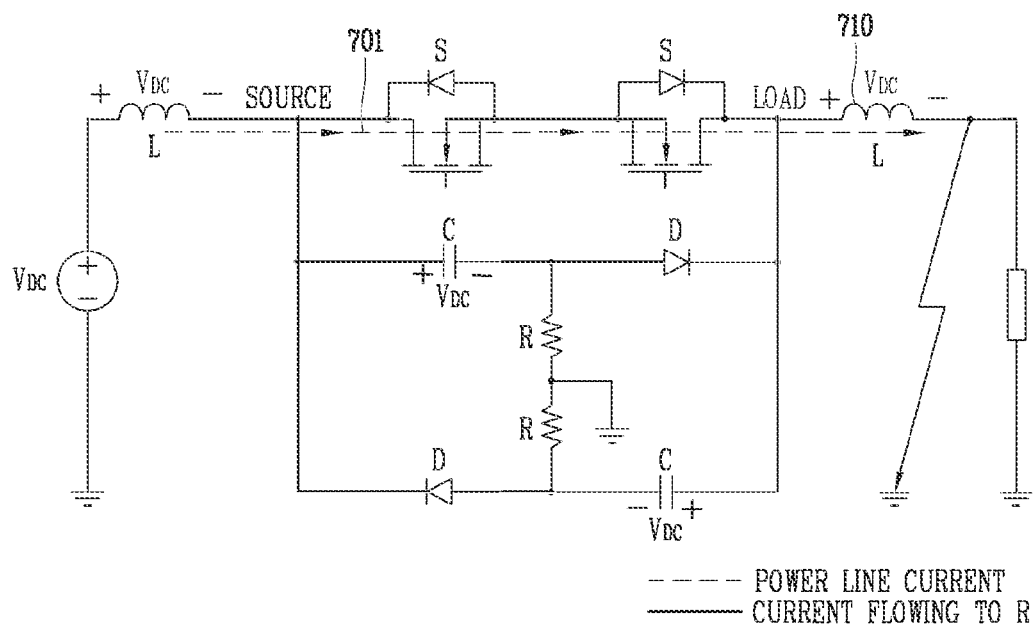

Hereinafter, how the bidirectional circuit breaker interrupts a fault current when a short circuit event occurs at the load side will be described in detail with reference to FIGS. 6 to 9. FIG. 6 shows a normal current flow 601, in normal conditions, in which current flows out of a power supply 1 side, through a source node and a load node, and into a load 2 side. When a short circuit event or accident occurs at the load 2 side, an abnormal current flow 701 of accumulation of a voltage Vdc in a reactor 710 at a rear end of a load node may be generated as shown in FIG. 7. Or, when a short circuit event occurs at the power supply 1 side, an abnormal current flow of accumulation of a voltage Vdc in a reactor L at the power supply 1 side may be generated.

Figure 8:
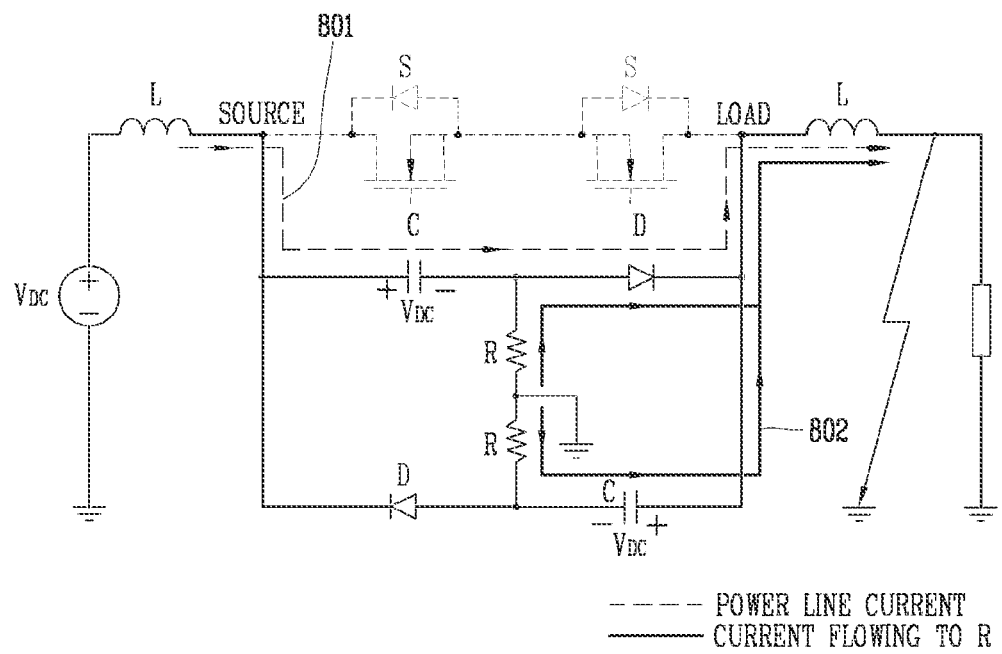
Figure 9:
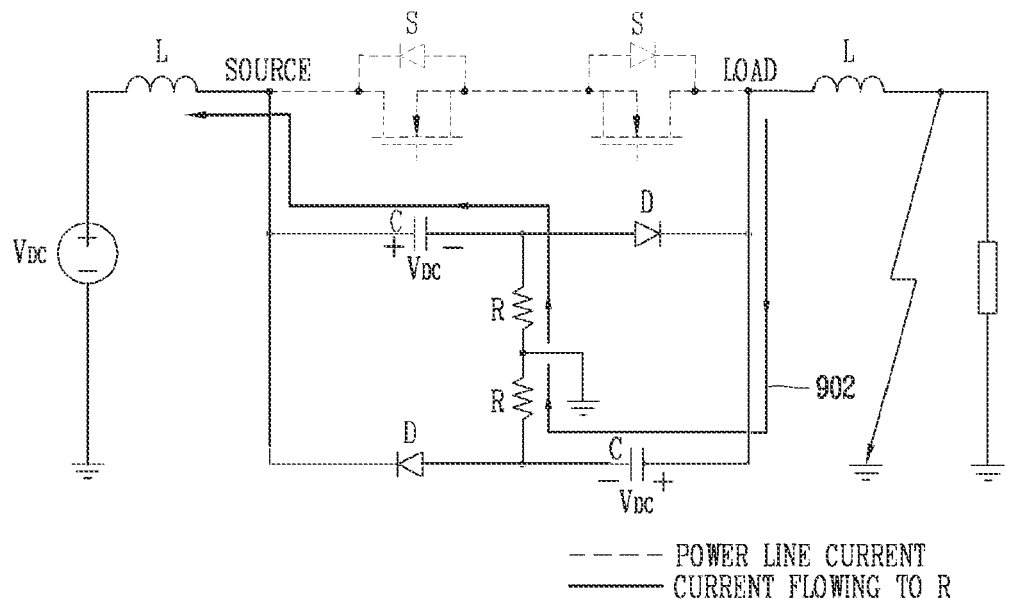

Then, as illustrated in FIG. 8, a second current flow 802 is generated as a second capacitor of a second circuit line is discharged to prevent an overvoltage. And then, a current flow 801 from the source node to a first MOSFET switch is changed such that current flows from the source node to the load node through a first capacitor and first diode of a first circuit line, and thus the MOSFET switch can be properly protected from overvoltage. Thereafter, as shown in FIG. 9, a reverse current flow 902 that flows from a reactor L, through the load node, the second capacitor of the second circuit line, a plurality of resistors, the first capacitor of the first circuit line and the source node, and to the power supply side is generated.

Figure 10:
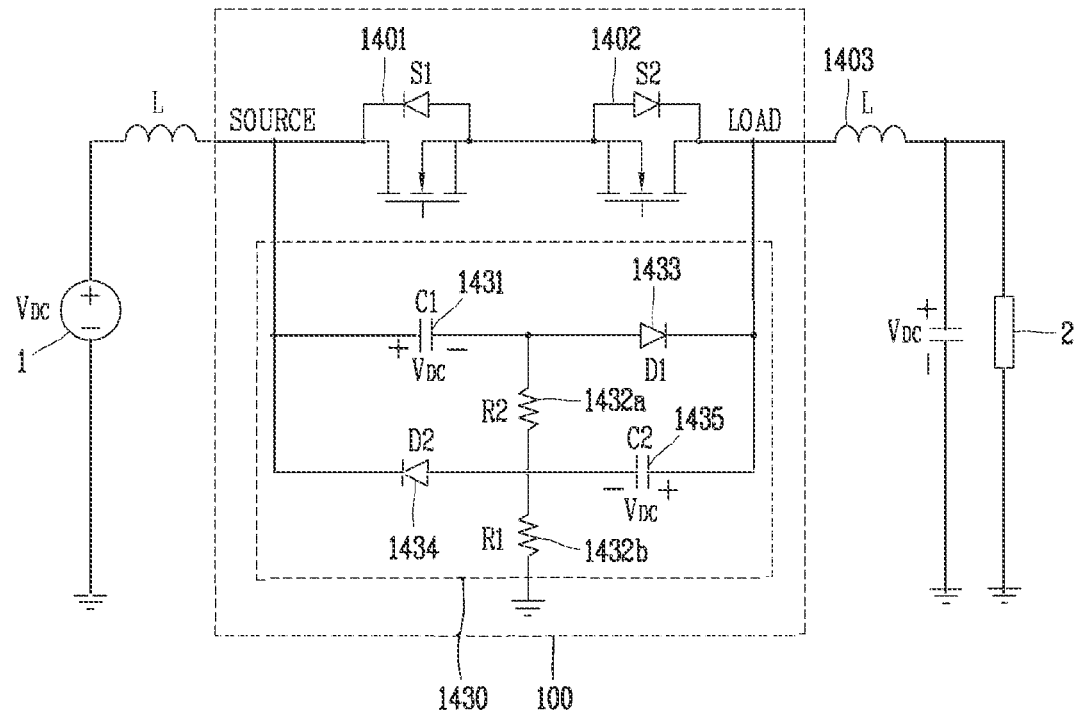
FIG. 10 is a diagram illustrating a circuit of a bidirectional circuit breaker that includes an asymmetrical snubber circuit according to another implementation of the present disclosure.

FIG. 10 is a diagram illustrating a circuit of a bidirectional circuit breaker that includes an asymmetrical snubber circuit according to another implementation of the present disclosure. That is, not only the snubber circuit described above, but also an asymmetrical snubber circuit may be available.

A snubber circuit 1430 illustrated in FIG. 10 also provides switch overvoltage protection and quick interruption of bidirectional fault current. The difference from the symmetrical snubber circuit of FIG. 5 is that a resistor R2 is disposed between a first circuit line and a second circuit line, and a resistor R1 is not disposed between the first circuit line and the second circuit line. Here, the resistor R1 is disposed adjacent to a second capacitor of the second circuit line. However, even in this case, the two resistors R1 and R2 are connected in series.

In detail, an asymmetrical snubber circuit 1430 is disposed in parallel with a first switch S1 (1401) and a second switch S2 (1402) that are arranged in series between a power supply 1 and a load 2. Here, a reactor 1403 represents (the amount of) inductance generated by the load 2.

One end of a first resistor 1432a may be connected to a connection point between a first capacitor 1431 and a first diode 1433. The other end of the first resistor 1432a may be connected to a connection point between a second capacitor 1435 and a second diode 1434.

In addition, one end of a second resistor 1432b may be connected in series with the first resistor 1432a at a connection point between the second capacitor 1435 and the second diode 1434. The other end of the second resistor 1432b may be connected to a ground point.

Accordingly, the first circuit line in which the first capacitor 1431 and the first diode 1433 are arranged in series and the second circuit line in which the second diode 1434 and the second capacitor 1435 are arranged in series are disposed in parallel with the first resistor 1432a interposed therebetween.

Meanwhile, the second resistor 1432b is connected in series with the first resistor 1432a and is disposed adjacent to the second capacitor C2, unlike the example of FIG. 5 in which the second resistor 1432b is disposed between the first circuit line and the second circuit line. Accordingly, an asymmetrical snubber circuit is formed, unlike the example of FIG. 5 in which the snubber circuit is symmetrical with respect to the third circuit line that includes the resistor.

In such an asymmetrical snubber circuit, when fault conditions occur at the power supply side, such as an ESS, in a condition having a low power inductance, current paths of current flowing from a ground path are all directed to the semiconductor switches S1 and S2. Accordingly, current flowing to the power supply side does not increase beyond a target current interruption (or blocking) level. Therefore, in the case of asymmetrical inductance, the asymmetrical snubber circuit may be used as a snubber circuit of a semiconductor breaker through appropriate R, C, and D designs.

Figure 19:
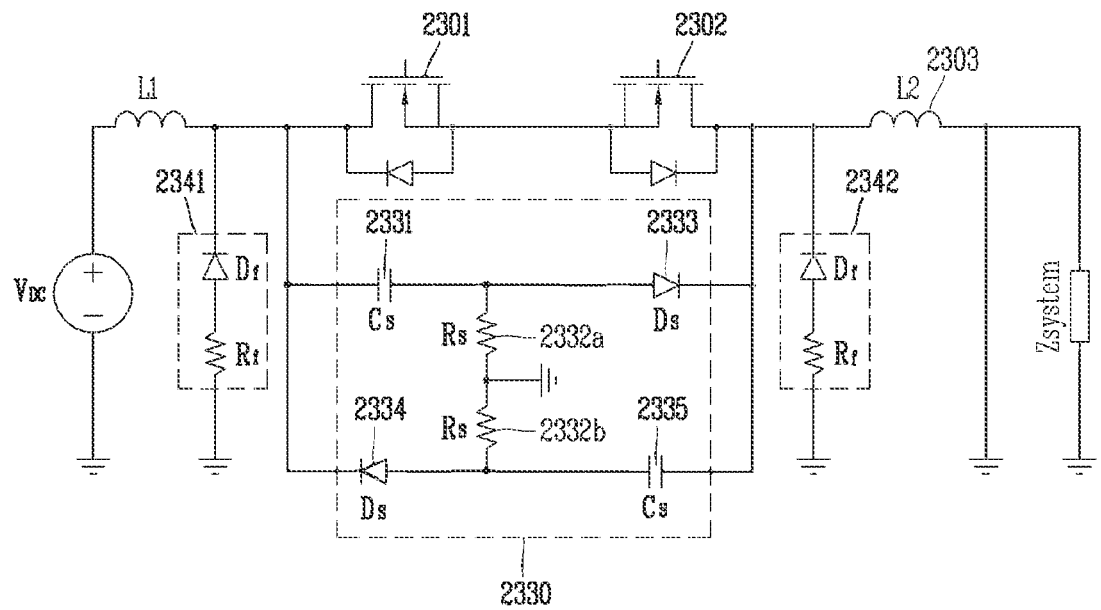
FIG. 19 illustrates a configuration of another example of a bidirectional circuit breaker to which a freewheeling circuit is added.

FIGS. 15 to 18 are exemplary diagrams for explaining interruption operation when a short circuit event occurs at a power supply side in a bidirectional circuit breaker to which the asymmetrical snubber circuit according to FIG. 10 is applied. FIGS. 19 to 22 are exemplary diagrams for explaining specific operations in normal and fault conditions of a bidirectional circuit breaker to which the freewheeling circuit according to FIG. 19 is added.

Figure 11:
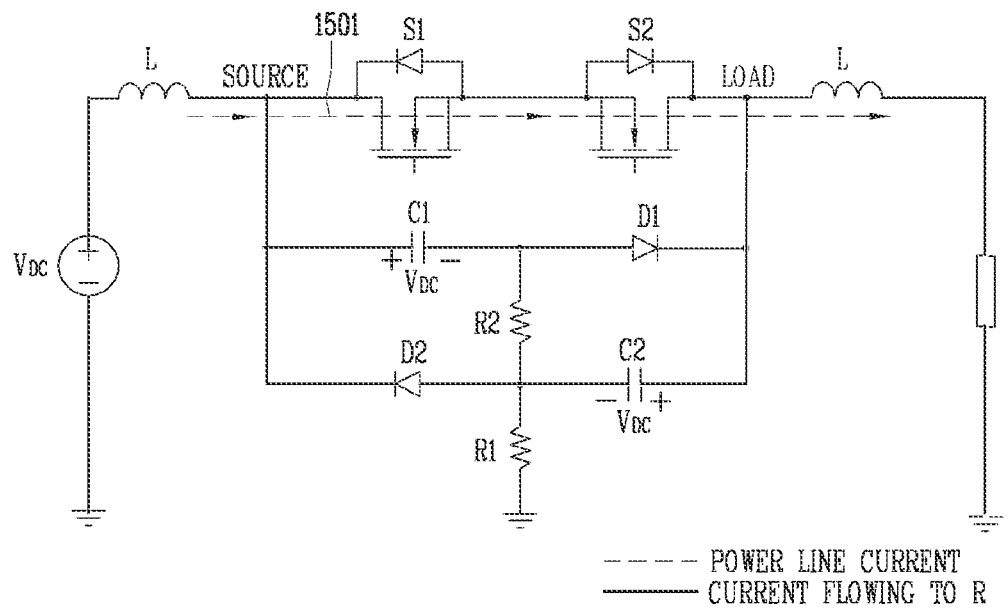
FIGS. 11 to 14 are exemplary diagrams for explaining interruption operation when a short circuit event occurs at a load side in a bidirectional circuit breaker to which the asymmetrical snubber circuit according to FIG. 10 is applied.
Figure 12:
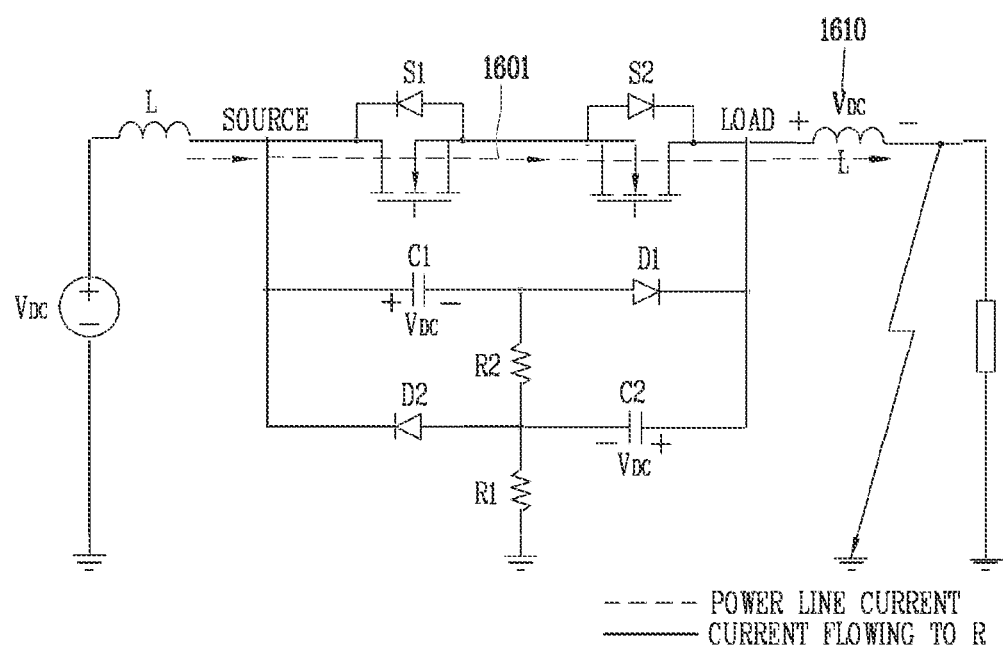
Figure 13:
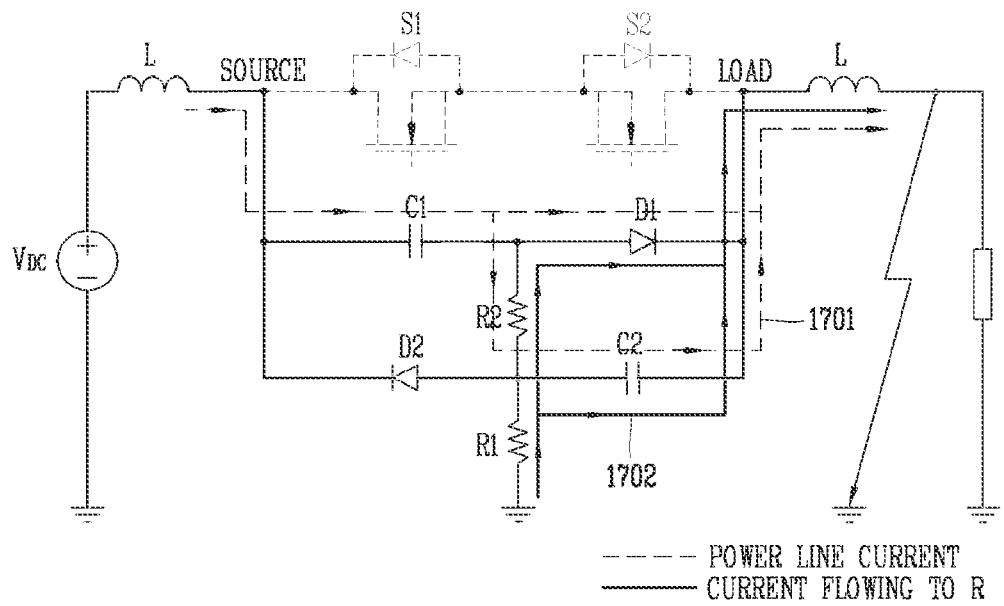

FIG. 11 shows, in normal conditions, a current flow 1501 that flows to a load side through a source node, a first switch S1, a second switch S2, a load node, and a reactor L. FIG. 12 shows an abnormal current flow 1601 of accumulation of a Vdc voltage in a reactor 1610 as a short circuit event occurs on the load side. FIG. 13 shows a current flow 1702, which is a flow of current flowing to a resistor R1 for forming a ground path, in which current flows through R1 and R2, a first diode D1 and a second capacitor C2, meets (or joins) at the load node, then flow to the reactor L. Then, a fault current 1701 caused by the short circuit flows from the source node to the reactor L through the first capacitor C1 and the first diode D1, instead of flowing from the source node to the first switch S1. Also, as shown in FIG. 13, a current flow is branched from the first capacitor C1 and flows to the reactor L through a resistor R2 and the second capacitor C2.

Figure 14:
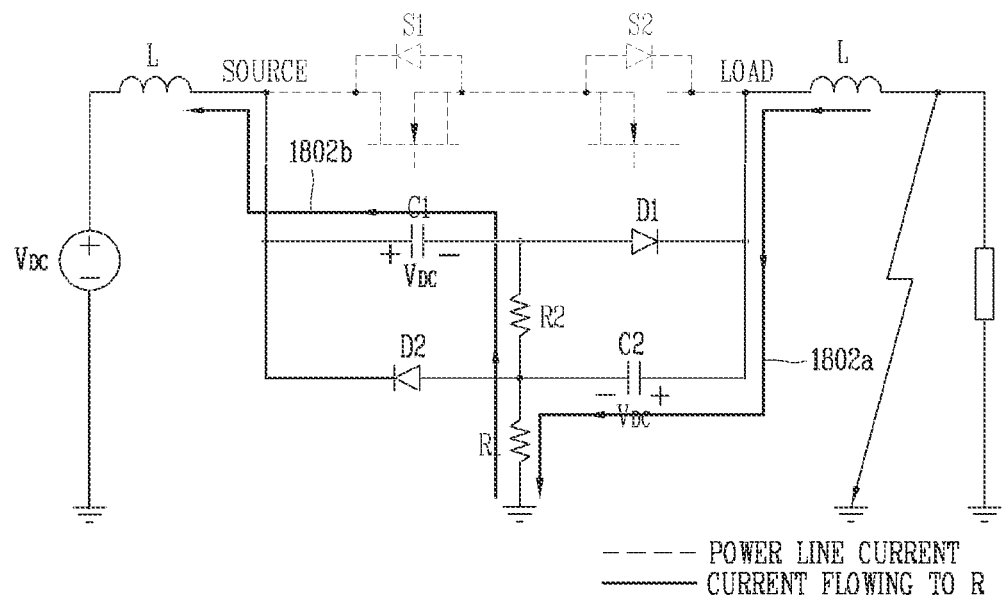

Next, as shown in FIG. 14, a ground path of a first reverse current flow 1802a that flows from the reactor L, through the load node and the second capacitor C2, and to the resistor R2 is formed. In addition, a ground path of a second reverse current flow 1802b that flows from the resistor R2, through the resistor R1, the first capacitor C1 and the source node, and to the power supply side is generated.

Figure 15:
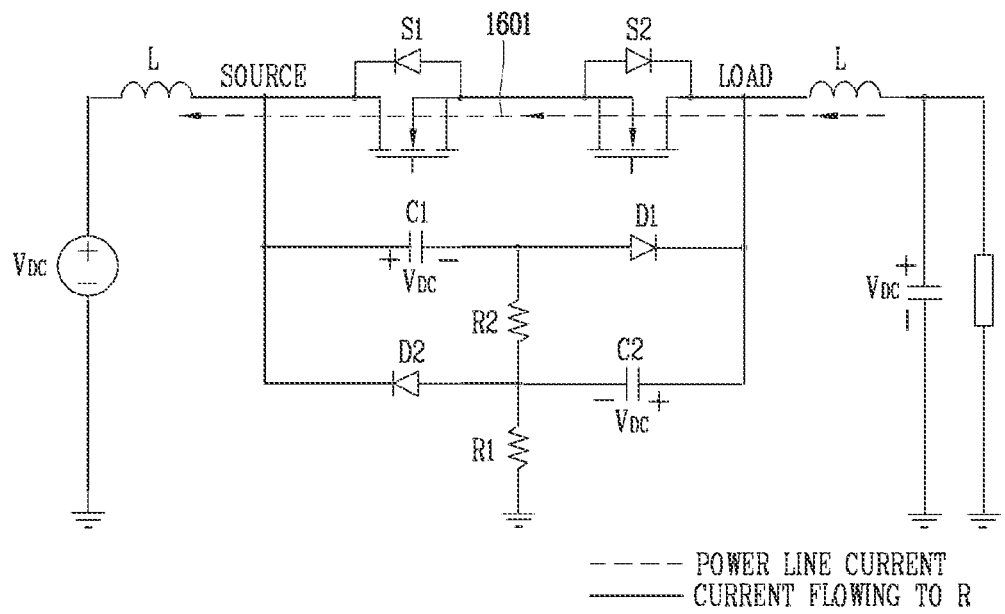
FIGS. 15 to 18 are exemplary diagrams for explaining interruption operation when a short circuit event occurs at a power supply side in a bidirectional circuit breaker to which the asymmetrical snubber circuit according to FIG. 10 is applied.
Figure 16:
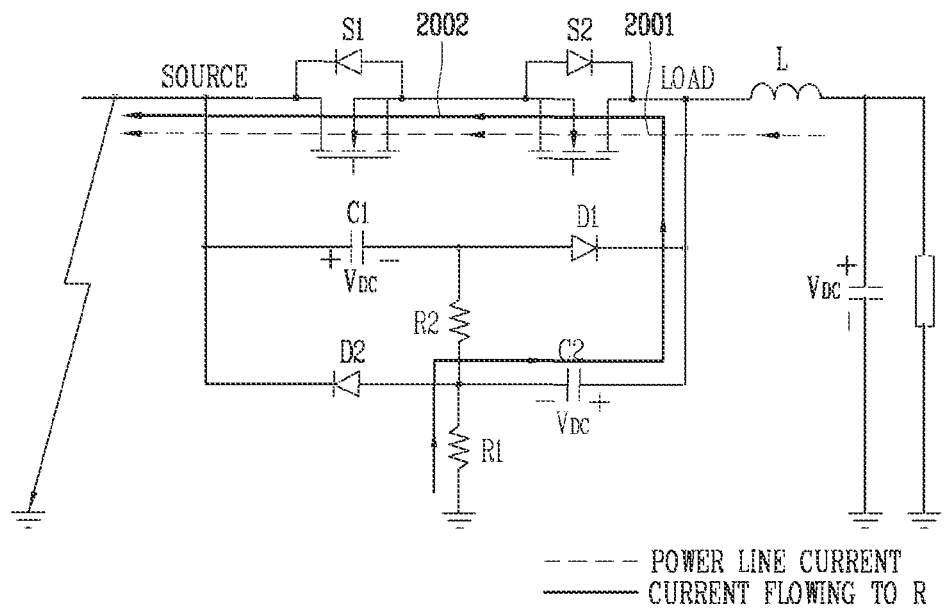
Figure 17:
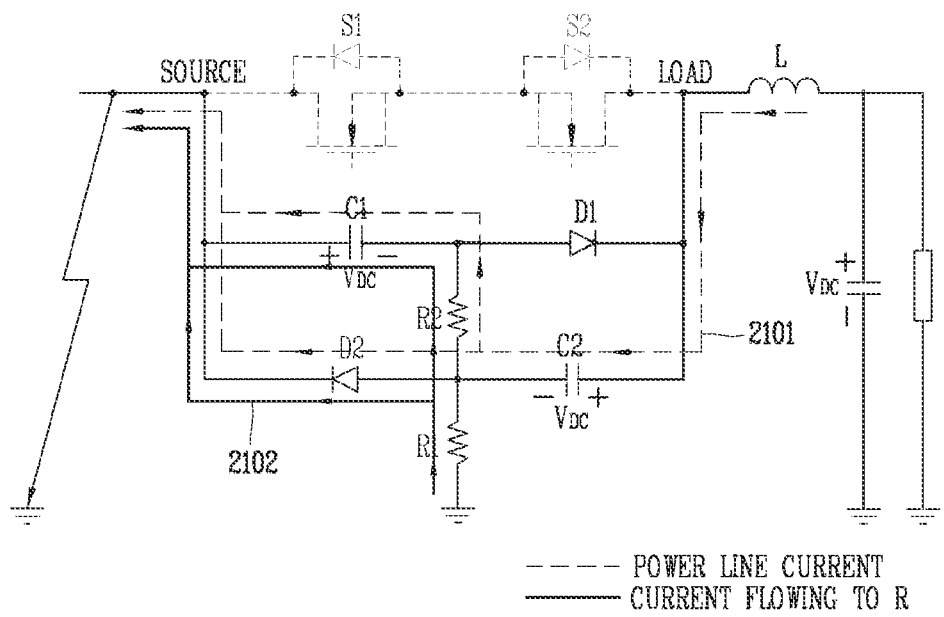
Figure 18:
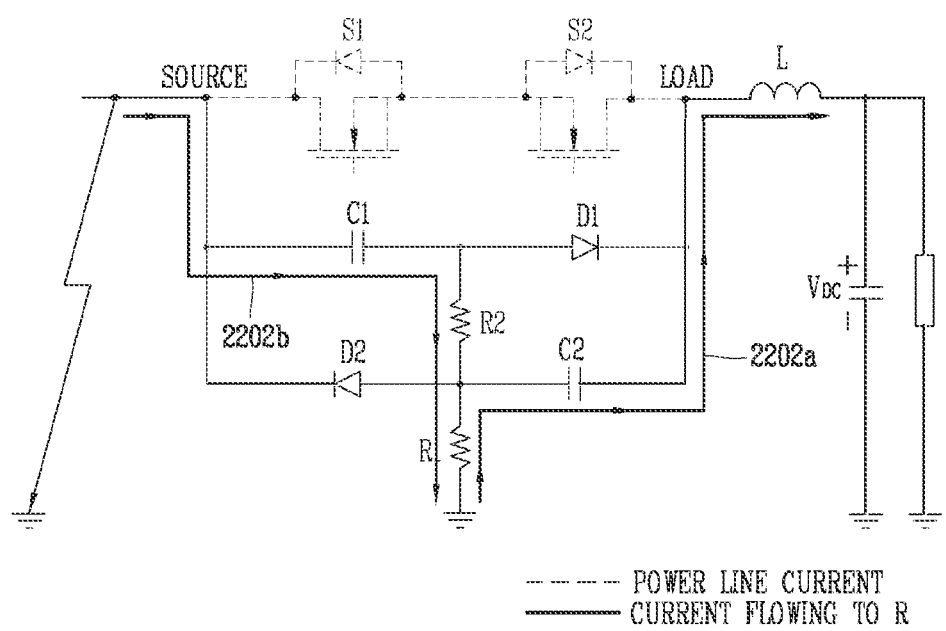

FIG. 15 illustrates another example of a current flow 1901 in normal conditions that flows from a load side, through a reactor L, a load node, a second switch S2, a first switch S1 and a source node, and to a power supply side.

When a short circuit event occurs on the power supply side, a current flow 2001 that has the same flow direction as the current flow 1901 of FIG. 15 is formed. Along with it, a resistor R1 current flow 2002 that flows to the power supply side through a resistor R1, a second capacitor C2, the load node, the second switch S2, the first switch S1, and the source node is generated. Then, a resistance R1 current flow 2102 that flows to the power supply side through the resistor R1, the resistor R2, a first capacitor C1, a second diode D2, and the source node is generated. Meanwhile, a flow path of fault current caused by a short circuit is changed to a fault current flow 2101 that flows from the reactor L, through the load node, the second capacitor C2, the first capacitor C1, and the second diode D2, without passing through the semiconductor switches S1 and S2. Thereafter, a first reverse current flow 2202b that flows from the source node, through the first capacitor C1 and the second resistor R2, and to ground of the resistor R1 is formed. In addition, a second reverse current flow 2202a that flows from the resistor R1, through the second capacitor C2, the load node and the reactor L, and to the load side is generated to thereby protect the semiconductor switches.

Figure 20:
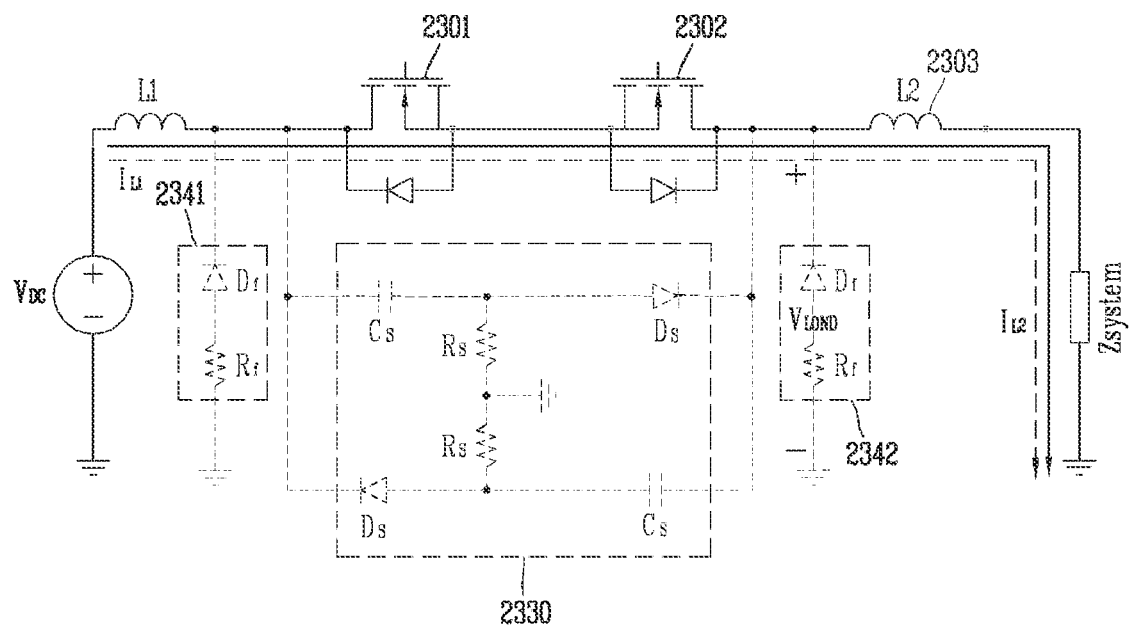
FIGS. 20 and 21 are exemplary diagrams for explaining specific operations in normal and fault conditions of a bidirectional circuit breaker to which the freewheeling circuit according to FIG. 19 is added.
Figure 21:
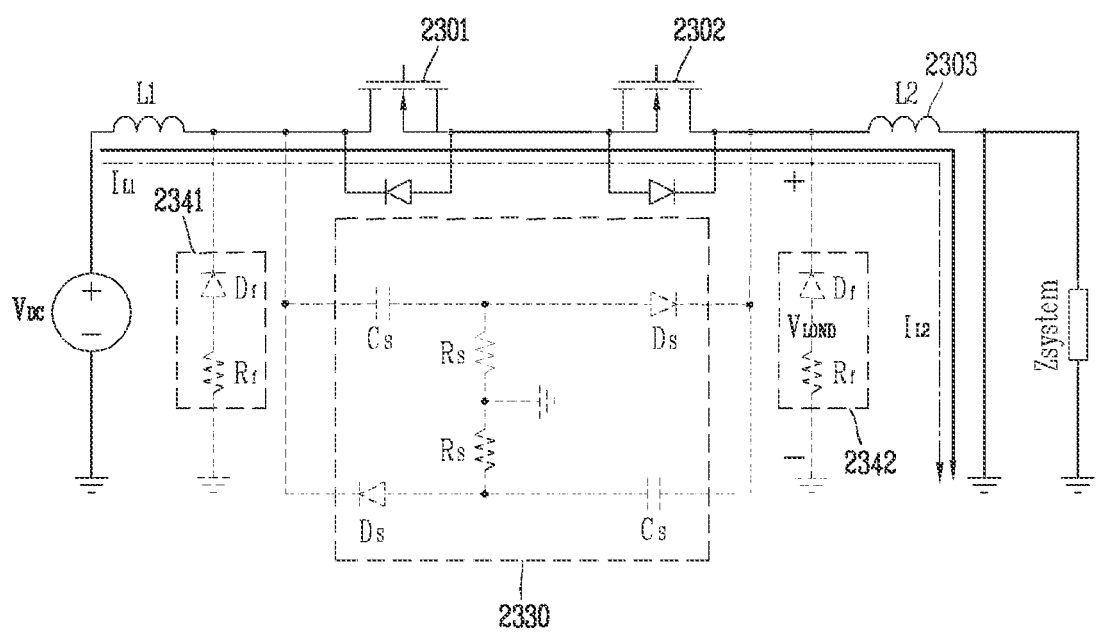

FIG. 19 illustrates a configuration of another example of a bidirectional circuit breaker to which a freewheeling circuit is added. FIGS. 20 and 21 are exemplary diagrams for explaining specific operations in normal and fault conditions of s bidirectional circuit breaker to which the freewheeling circuit according to FIG. 19 is added.

As illustrated in FIG. 19, a bidirectional circuit breaker to which a freewheeling circuit of the present disclosure is added may include a main circuit unit, a snubber circuit unit 2330, and first and second freewheeling circuits 2341 and 2342.

The main circuit unit is connected between a power supply and a load (Z system), and first and second semiconductor switches 2301 and 2302 are arranged in series. In addition, the snubber circuit unit 2330 is configured such that one end thereof is connected in parallel with a front end of the first semiconductor switch 2301 and the other end thereof is connected in parallel with a rear end of the second semiconductor switch 2302.

Here, the first semiconductor switch 2301 may be configured such that a first MOSFET and a first parallel diode are connected in parallel. Also, the second semiconductor switch 2301 may be configured such that a second MOSFET and a second parallel diode are connected in parallel.

The first MOSFET and the second MOSFET may be N-channel MOSFETs. Here, one end and the other end of the first parallel diode may be connected to a source and a drain of the first MOSFET, respectively. In addition, one end and the other end of the second parallel diode may be connected to a drain and a source of the second MOSFET, respectively. As such, the bidirectional semiconductor circuit breaker according to the present disclosure may be achieved by the first and second semiconductor switches 2301 and 2302 configured in a complementary symmetrical shape.

Meanwhile, the snubber circuit unit 2330 includes a first circuit line having a first capacitor 2331 (Cs) and a first diode 2333 (Ds) arranged in series. In addition, the snubber circuit unit 2330 further includes a second circuit line that is connected in parallel with the first circuit line, and has a second diode 2334 (Ds) and a second capacitor 2335 (Cs) arranged in series. Here, the first circuit line may be connected in series in the order of the first capacitor 2331 and the first diode 2333, and the second circuit line may be connected in series in the order of the second diode 2334 and the second capacitor 2335.

The snubber circuit unit 2330 may further include a third circuit line having one end connected to the first circuit line and the other end connected to the second circuit line, and having a first resistor 2332a (Rs) and a second resistor 2332b (Rs) arranged in series. Here, one end of the third circuit line may be connected to the other end of the first capacitor 2331 and one end of the first diode 2333. Also, the other end of the third circuit line may be connected to one end of the second diode 2334 and the other end of the second capacitor 2335.

The first resistor 2332a and the second resistor 2332b may be connected to a ground point therebetween. In addition, the snubber circuit 2330 may be point symmetric with respect to the ground point.

Due to the first resistor 2332a and the second resistor 2332b, a voltage drop caused by a fault current flowing into a snubber circuit unit 2300 may be increased. Accordingly, the first resistor 2332a and the second resistor 2332b may provide the ground point, which is a ground path through which the fault current flows, at a connection point between the first resistor 2332a and the second resistor 2332b. The first resistor 2332a and the second resistor 2332b may be configured as a non-linear resistor element and be connected in series with each other.

Meanwhile, the first freewheeling circuit 2341 that consists of a third diode Df and a third resistor Rf is formed at an input portion (or input) of the circuit breaker, and is configured to suppress an overvoltage occurrence during trip operation of the circuit breaker. In detail, the first freewheeling circuit 2341 includes the third diode Df connected in parallel with the power supply at a power node of the first semiconductor switch 2301. In addition, the first freewheeling circuit 2341 further includes the third resistor Rf connected in parallel between the third diode Df and the ground.

The second freewheeling circuit 2341 that consists of a fourth diode Df and a fourth resistor Rf is formed at an output portion (or output) of the circuit breaker. In detail, the second freewheeling circuit 2341 includes the fourth diode Df connected in parallel with the load (Z system) at a load node of the second semiconductor switch 2302. In addition, the second freewheeling circuit 2341 further includes the fourth resistor Rf connected in parallel between the fourth diode Df and the ground.

Here, the power supply may include an inductor component, and the load (Z system) may include an inductor component. In this regard, the power supply side inductor component may be equivalent to a first inductor L1 connected to the power supply. Meanwhile, the load side inductor component may be equivalent to a second inductor L2 connected to the load (Z system).

Referring to FIGS. 5 and 19, when resistance Rs of the snubber circuit units 1030 and 2330 is small, a voltage charged in the snubber capacitance Cs (C1) may be discharged until the circuit breaker is operated in the event of fault conditions, depending on reactance condition of the system. In this case, a time delay occurs as much as a charging time of the snubber capacitance Cs (C1) when the circuit breaker is operated, and thus an overvoltage generated during the interruption may not be prevented.

Figure 24:
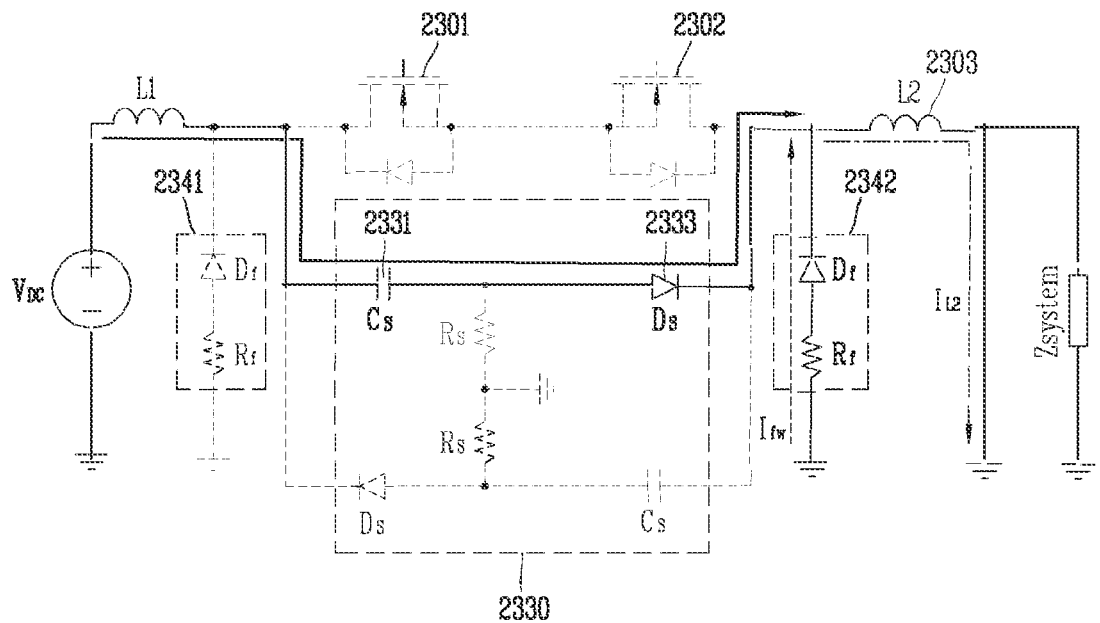
FIGS. 24 and 25 are exemplary diagrams for explaining specific operations in normal and fault conditions of a bidirectional circuit breaker to which the freewheeling circuit according to FIG. 19 is added.

In order to prevent such an overvoltage, a freewheeling circuit consisting of a diode Df and a resistor Rf may be added to both ends of the circuit breaker as shown in FIG. 24. The freewheeling circuits may suppress an overvoltage occurring during trip operation of the circuit breaker, due to inductance at a fault point.

In normal conditions, as illustrated in FIG. 24, normal current flows to a load side through L1 and L2, and a SSCB. Here, Cs (C1, C2) of a snubber circuit is charged with a power supply voltage of Vdc.

Figure 25:
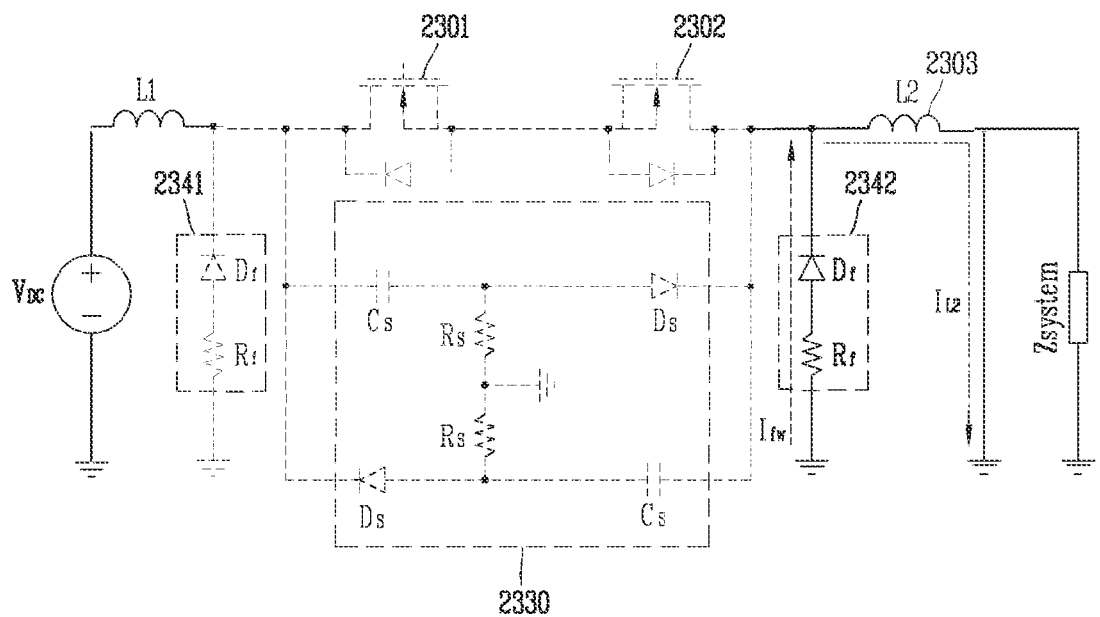

When a short circuit event occurs at the load side as shown in FIG. 25, a fault current rises rapidly. Here, if resistance Rs of the snubber circuit is large (or high) enough, the voltage charged in the Cs (C1, C2) of the snubber circuit is not discharged, owing to the Rs, allowing the fault current caused by the power supply voltage to only flow. Here, a change of the amount of current (di/dt) flowing through the inductor in the event of fault occurrence is determined by an Equation 1.

$$\frac{di_{L1,L2}}{dt} = \frac{Vdc}{L_1 + L_2} \qquad [\text{Equation 1}]$$

Figure 22:
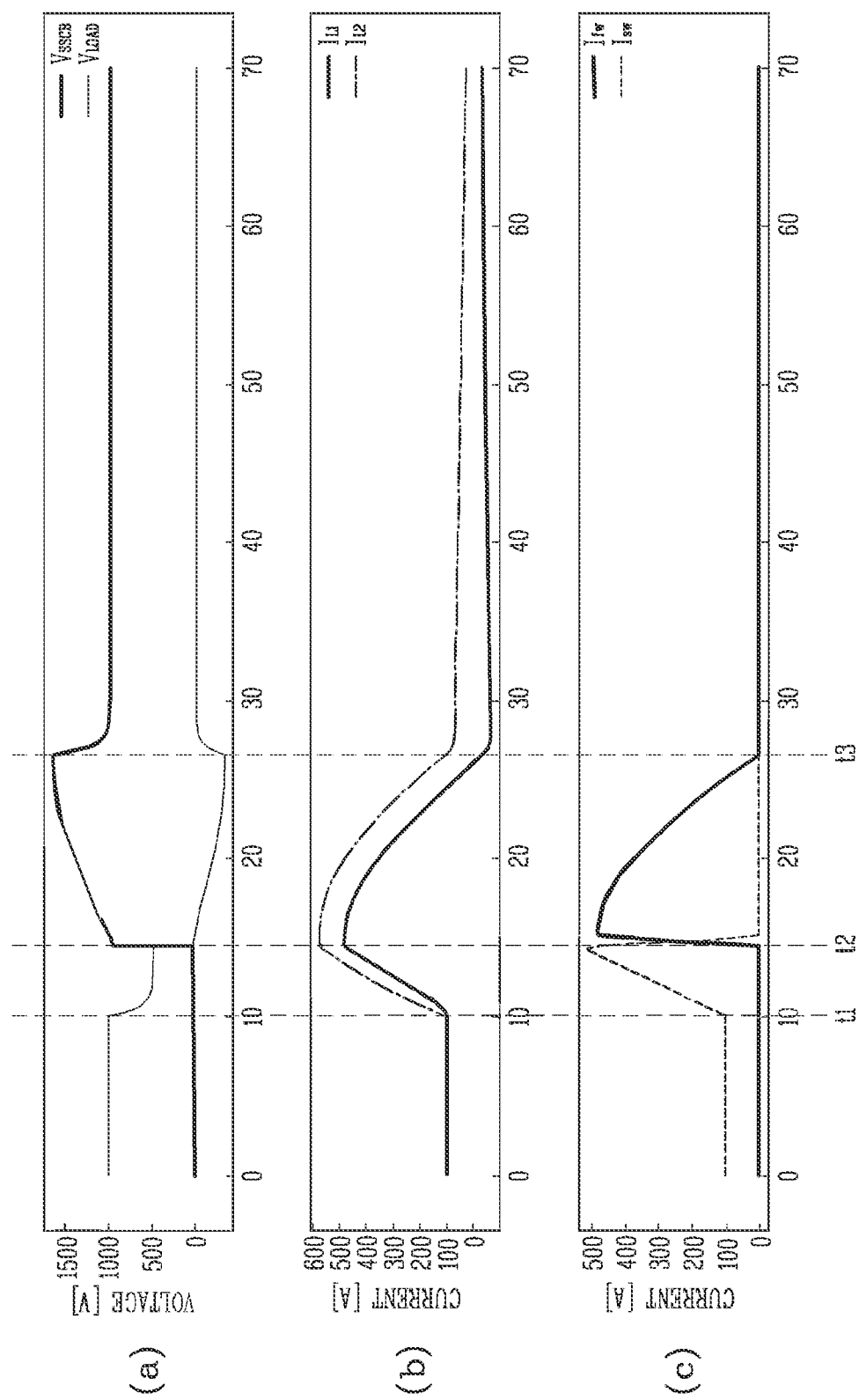
FIG. 22 illustrates voltage waveforms applied to a semiconductor switch and a load, and current waveforms at various points in relation to the present disclosure.

FIG. 22 illustrates voltage waveforms applied to a semiconductor switch and a load, and current waveforms at various points in relation to the present disclosure. Here, $V_{SSCB}$ and $V_{Load}$ represent voltage waveforms respectively applied to the semiconductor switch and the load over time.

In regard to FIG. 22, a reflux circuit is not provided separately, but the snubber circuit also serves to function as the reflux circuit. In (b) of FIG. 22, a fault current $I_{L2}$ at L2 is greater than a fault current $I_{L1}$ at L1. Since a snubber R value is small, current discharged through the resistor and the diode at the top is all included.

In regard to (b) and (c) of FIG. 22, since the snubber circuit is also used as the reflux circuit, a time point at which the fault current $I_{L1}$ at the L1 is removed is a time point $t_3$ at which the snubber operation ends.

Figure 23:
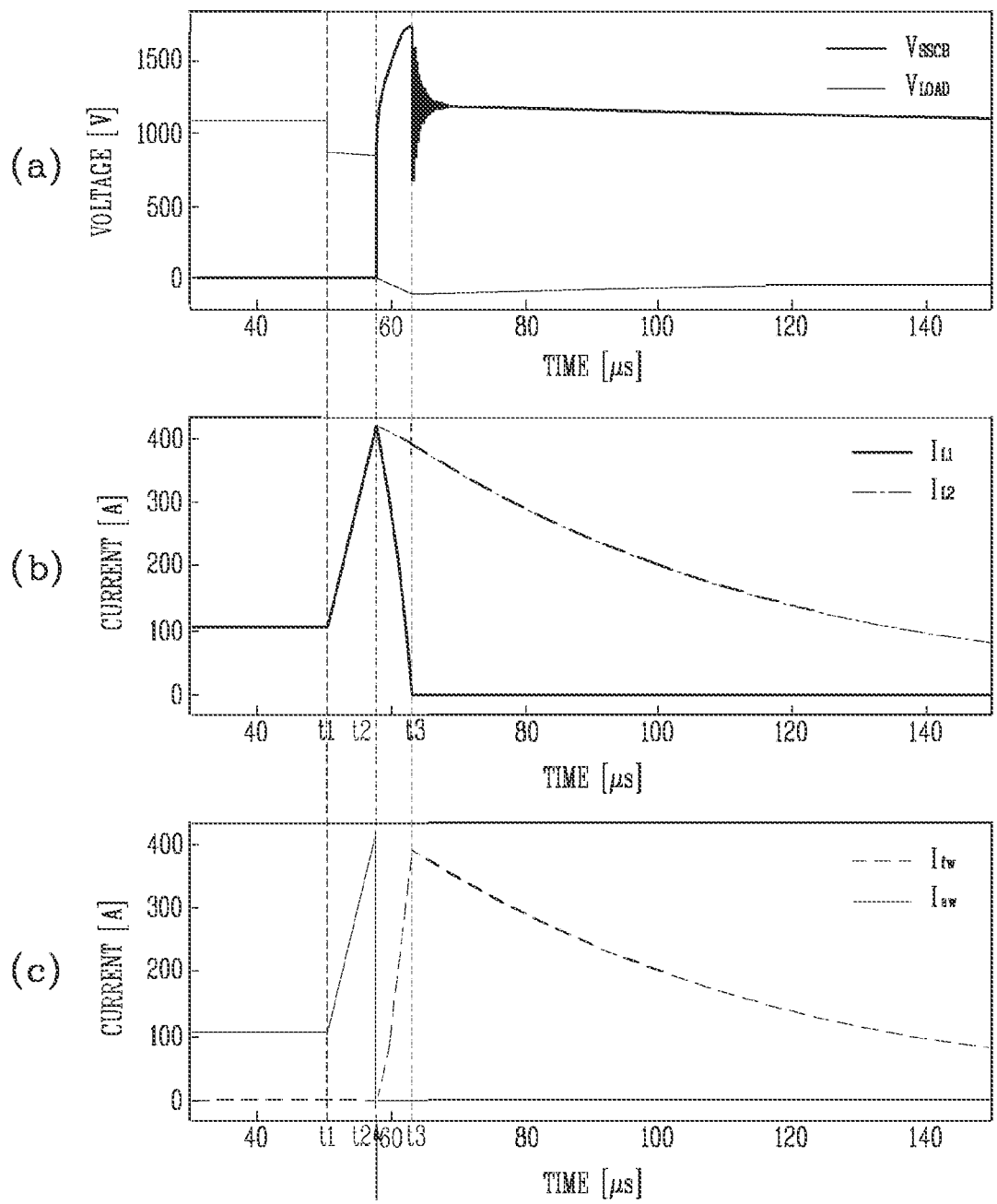
FIG. 23 illustrates voltage waveforms applied to a semiconductor switch and a load, and current waveforms at various points in accordance with the present disclosure.

FIG. 23 illustrates voltage waveforms applied to a semiconductor switch and a load, and current waveforms at various points in accordance with the present disclosure. Here, $V_{SSCB}$ and $V_{Load}$ are voltage waveforms respectively applied to the semiconductor switch and the load over time.

In detail, (a) of FIG. 23 shows voltage waveforms applied to the semiconductor switch and the load according to the present disclosure. (b) of FIG. 23 shows waveforms of current flowing through power supply side inductance and load side inductance in accordance with the present disclosure. (c) of FIG. 23 shows a waveform of fault current and a waveform of semiconductor switch in accordance with the present disclosure.

Referring to FIG. 22, in the case of the fault current at the L1, it may take a considerable time to completely remove the fault current, which may last until operation of the snubber circuit ends. In contrast, referring to FIG. 23, a fault current at L1 is immediately removed at a time point $t_3$.

In the case of FIG. 22, the snubber circuit and the reflux circuit are used together, and the snubber R value is small. Therefore, current discharged through the snubber circuit in the event of a short circuit is not a negligible amount (or level). Meanwhile, since L2 current equals L1 current+ snubber discharge current, the L2 current is greater than the L1 current.

Referring to (c) of FIG. 23, current flowing through the semiconductor switch increases at a time point $t_1$ at which a short circuit event occurs. For example, the current flowing in the semiconductor switch may increase from 100A at the time point $t_1$ of the short circuit occurrence to 400A at a time point $t_2$.

As shown in FIG. 24, when the SSCB detects a fault current and trips, the semiconductor switch is turned off, and the fault current is bypassed to snubber circuits, namely, Cs (C1) and Ds. Here, a power supply voltage is charged in the capacitor C1 (Cs) of the snubber circuit to thereby instantly interrupt the fault current applied from the power supply side.

In this regard, a current $I_{sw}$ flowing through the semiconductor switch may be sensed through a current sensor at an inside or outside of the SSCB. Meanwhile, when the current flowing in the semiconductor switch reaches a protection level, a turn-off signal may be transmitted to the semiconductor switch from the inside or outside of the SSCB.

Accordingly, when the current flowing in the first and second semiconductor switches 2301 and 2302 reaches the protection level after the time point $t_1$, the first and second semiconductor switches 2301 and 2302 may be turned off at the time point $t_2$.

Therefore, referring to (c) of FIG. 23, the semiconductor switches are turned off at the time point $t_2$, and the current $I_{sw}$ flowing in the semiconductor switches become zero (0). A current interruption time $t_2$-$t_1$ during which the semiconductor switches are turned off is approximately 400 to 500 ns, thereby achieving quick current interruption.

Meanwhile, a voltage of the snubber capacitor (Cs) may be maintained as Vdc, the same as a voltage of the power supply circuit, before the time point $t_1$ at which the short circuit occurs. That is, the voltage of the first capacitor (Cs) of the snubber circuit unit 2330 may be maintained equal to Vdc of the voltage of the power supply before the time point $t_1$ of the short circuit occurrence. By pre-charging the voltage to the Vdc, an additional increase in the fault current (i.e., current flowing in the source node or the load node) at the time point $t_2$ at which the first and second semiconductor switches 2301 and 2302 are turned off may be prevented.

In conclusion, since the voltage of the power supply circuit and the voltage of the snubber capacitor (Cs) are equal, an additional increase in the fault current (i.e., the current flowing in the source node or the load node) may be prevented. Further, the voltage $V_{SSCB}$ applied to the semiconductor switch does not exceed a maximum allowable voltage value.

In this regard, when a voltage value of the power supply circuit and a voltage value of the snubber capacitor (Cs) are not the same, a fault current (i.e., current flowing in the source node or the load node) may be significantly increased. Accordingly, in order to prevent this problem, the power supply circuit and the snubber capacitor (Cs) are configured to have the same voltage value in the present disclosure. Thus, the fault current (i.e., the current flowing in the source node or the load node) does no increase further.

In detail, referring to (a) of FIG. 23, a voltage applied to the semiconductor switch at the time point $t_2$ does not exceed the maximum allowable voltage value and is converged to a predetermined value within a predetermined time. Referring to (c) of FIG. 23, the current does not increase further from 400A, and becomes zero (0) at the time point $t_2$.

In addition, energy charged in the power supply side inductance L1 may be charged in excess of the power supply voltage in the Cs (C1). Here, a voltage and capacitance of the snubber capacitor Cs should be determined in consideration of a withstand voltage of the semiconductor device that interrupts a fault current. Voltages at both ends of the circuit breaker may be represented by an Equation 2.

$$V_{SSCB}(t) = V_{dc} + I_{fault}\sqrt{\frac{L_1}{C_s}} \sin\left(\frac{t-t_2}{\sqrt{L_1 C_s}}\right) \quad \text{[Equation 2]}$$

Here, the voltage of the semiconductor switch should not exceed a maximum interruption voltage of the switch. Therefore, the snubber capacitance Cs should be determined by the following Equation 3.

$$Cs > \frac{L_1 I_{fault}^2}{(V_{SSCB,max} - V_{dc})^2} \quad \text{[Equation 3]}$$

ted in FIG. 24, energy charged in the load side inductance L2 starts to flow through the diode Df and the resistor Rf of the freewheeling circuit at the load side of the circuit breaker simultaneously when the semiconductor switches of the circuit breaker are turned off. Therefore, interruption is continued after energy charged in the L1 is exhausted and is completed when energy charged in the L2 through the freewheeling circuit is exhausted, as shown in FIGS. 24 and 25.

Referring to FIG. 19 and (c) of FIG. 23, a fault current $I_{fw}$ starts to flow through the second freewheeling circuit 2342 at a time point $t_2$ at which the semiconductor switches are turned off. In addition, current flowing from the first inductor L1 through the first circuit line of the snubber circuit unit 2300 at a time point $t_3$ after the time point $t_2$ becomes zero (0). The fault current $I_{fw}$ continuously increases to the time point $t_3$ and then decreases from the time point $t_3$. That is, after the time point $t_3$, the fault current $I_{fw}$ flowing through the first and second freewheeling circuit units 2341 and 2342 gradually decreases.

Here, a degree or amount of reduction in the fault current $I_{fw}$ flowing through the freewheeling circuit may be determined by a resistance value of the Rf and an inductance value of the L2 in the freewheeling circuit. Accordingly, when the resistance value of the Rf is selected a value that can rapidly decrease the fault current $I_{fw}$, the size of the freewheeling circuit may be increased. However, there in no need to quickly exhaust or consume energy charged in the L2 through the freewheeling circuit. Therefore, the resistance value of the Rf may be selected in consideration of the size of the freewheeling circuit and a time required to exhaust energy charged in the L2.

Meanwhile, the freewheeling circuit should be installed at both left and right sides of the circuit of the circuit breaker to enable bidirectional interruption of the circuit breaker. When fault conditions occur at the power supply side of the circuit breaker, the freewheeling circuit on the power supply side connected in parallel with the load side of the circuit breaker should interrupt a fault current and consume energy charged in the L1. In addition, energy in the load side inductance L2 also provides protection of overvoltage occurring during the interruption L2 through the Cs (C2) of the snubber circuit in the same manner as described in FIG. 21.

Accordingly, after the semiconductor switches are turned off, energy accumulated in the circuit breaker may be exhausted through the power supply side inductance L1 and load side inductance L2 circuits. After the energy accumulated in the power supply side is exhausted, energy remaining in the load side should be exhausted through the freewheeling circuit.

Figure 26:
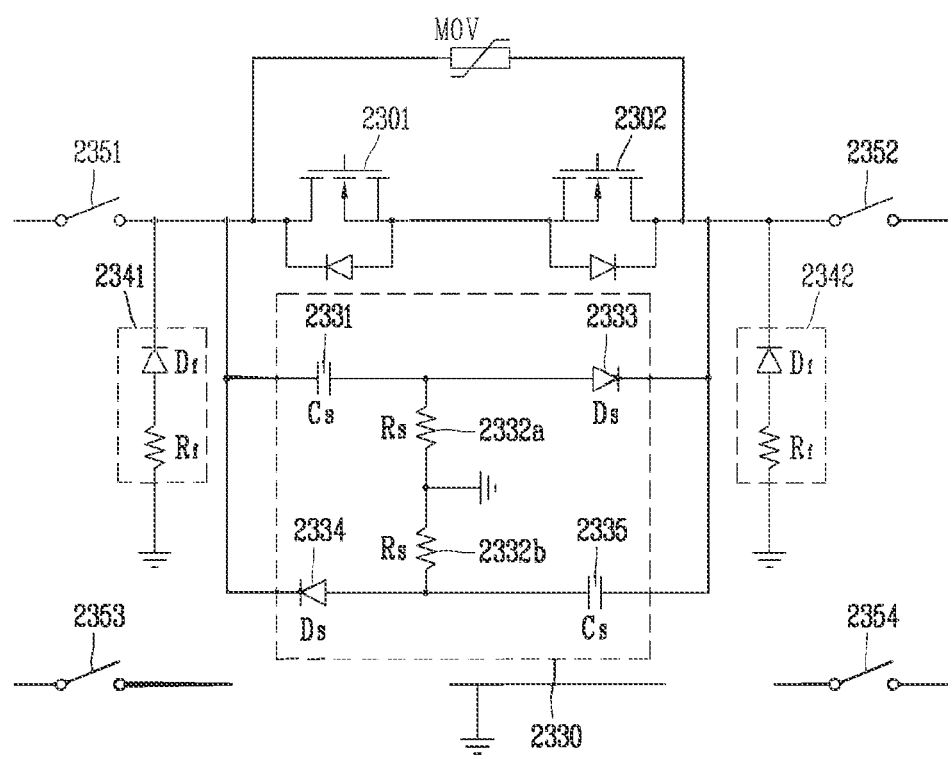
FIG. 26 illustrates a circuit structure in which a mechanical switch is connected in series with a semiconductor circuit breaker to both left and right contacts or one contact.

In addition, the SSCB should provide reliable physical insulation and overvoltage protection after interruption is completed. With reference to FIG. 26, a circuit structure in which the SSCB and mechanical switches are connected in series to both left and right contacts or one contact. Therefore, the circuit breaker according to the present disclosure may be configured as a circuit structure in which mechanical switches 2351 to 2354 are connected in series with the SSCB to the left and right contacts or one contact, so as to provide physical insulation and overvoltage protection after interruption is completed.

Referring to FIG. 26, after the semiconductor switches are turned off, the mechanical switches 2351 to 2354 are opened through a separate signal or a time delay to maintain physical insulation of the circuit breaker. In addition, the first and second semiconductor switches 2301 and 2302 may be disposed in parallel to be provided with a metal oxide varistor (MOV), so as to suppress an overvoltage. As for the MOV, when a voltage applied to the semiconductor switch is greater than or equal to a predetermined voltage, a resistance value becomes almost zero (0), allowing a current path to be changed. Accordingly, when a voltage applied to the first and second semiconductor switches 2301 and 2302 is greater than or equal to the predetermined voltage, the MOV may dump current to another path. For example, the current path may be changed to a path by the MOV, rather than a path by the first and second semiconductor switches 2301 and 2302, and a path by the snubber circuit unit 2330.

Thus, when the power supply side inductance of the L1 is too large, for the snubber circuit, namely the Cs (C1) to handle or cover, an overvoltage may be suppressed through a MOV circuit. In addition, the semiconductor device of the circuit breaker may be protected from a surge introduced from the outside.

As described above, the bidirectional semiconductor circuit breaker according to the present disclosure is a bidirectional semiconductor circuit breaker including a snubber circuit that can provide semiconductor protection and current suppression, and be used for interrupting bidirectional fault current. Accordingly, a semiconductor circuit breaker or a semiconductor module of a switch may be installed in an easier manner. Also, the design of a semiconductor circuit breaker having high performance and reliability may be accomplished. More specifically, semiconductor protection from overvoltage may be achieved through a structure of the snubber circuit according to the present disclosure and resistor (R), capacitor (C), and diode (D) designs in the snubber circuit. Quick fault current interruption may be achieved through the resistor R design in the snubber circuit according to the disclosure. In addition, bidirectional operability against bidirectional fault current may be achieved through symmetry when disposing electrical devices (or elements) inside the snubber circuit according to the present disclosure. Furthermore, the bidirectional semiconductor circuit breaker according to the present disclosure may be configured as an asymmetrical snubber circuit, and thus current flowing to the power supply side does not increase beyond a target current interruption level even in a condition having a low power inductance when fault conditions occur.

In addition, freewheeling diode circuits connected in series with resistors at both ends of the power supply side and the load side of the circuit breaker may be added to suppress a charging current by inductance of points of the power supply side and the load side from being introduced when fault conditions occur on the power supply side or the load side of the bidirectional semiconductor breaker.

Furthermore, circuits such as a varistor and an arrester connected in parallel with both ends of the semiconductor breaker circuit may be further provided in order to suppress an increase in voltage at both ends of the semiconductor breaker caused by the inductance when the circuit breaker is operated. The foregoing description has been given of specific implementations of the present disclosure. However, the present disclosure may be implemented in various forms without departing from the spirit or essential characteristics thereof, and thus the implementations described above should not be limited by the detailed description provided herein. Moreover, even if any implementation is not specifically disclosed in the foregoing detailed description, it should be broadly construed within the scope of the technical spirit, as defined in the accompanying claims. Furthermore, all modifications and variations that fall within the metes and bounds of the claims, or equivalents of such metes and bounds are therefore intended to be embraced by the appended claims.

The invention claimed is:

1. A bidirectional semiconductor circuit breaker, comprising:
    a main circuit unit connected between a power supply and a load, and having first and second semiconductor switches arranged in series; and
    a snubber circuit unit having one end connected with a front end of the first semiconductor switch and another end connected with a rear end of the second semiconductor switch,
    wherein the snubber circuit unit comprises:
        a first circuit line in which a first capacitor and a first diode are arranged in series;
        a second circuit line connected in parallel with the first circuit line, and in which a second capacitor and a second diode are arranged in series; and
        a third circuit line having one end connected to the first circuit line and another end connected to the second circuit line, and in which a first resistor and a second resistor are arranged in series.

2. The circuit breaker of claim 1, further comprising a first freewheeling circuit that is provided at an input portion of the circuit breaker to be made up of a third diode and a third resistor, and suppresses an overvoltage generated during trip operation of the circuit breaker,
    wherein the first freewheeling circuit comprises:
        the third diode connected in with the power supply at a power supply node of the first semiconductor switch; and
        the third resistor connected in series between the third diode and ground.

3. The circuit breaker of claim 2, further comprising a second freewheeling circuit that is provided at an output portion of the circuit breaker to be made up of a fourth diode and a fourth resistor, wherein the second freewheeling circuit comprises:
the fourth diode connected with the load at a load node of the second semiconductor switch; and
the fourth resistor connected in series between the fourth diode and ground.

4. The circuit breaker of claim 1, wherein the power supply includes a power supply side inductor component, and the load includes a load side inductor component.

5. The circuit breaker of claim 4, wherein a voltage of the first capacitor of the snubber circuit is maintained the same as a voltage of the power supply before a time point $t_1$ at which a short circuit event occurs so that a fault current flowing in a power supply node or a load node does not increase further from a time point $t_2$ at which the first and second semiconductor switches are turned off.

6. The circuit breaker of claim 5, wherein the first and second semiconductor switches are turned off by receiving a turn-off signal from a current sensor at the time point $t_2$ when current flowing in the first and second semiconductor switches reaches a protection level after the time point $t_1$ of the short circuit event occurs.

7. The circuit breaker of claim 6, wherein a fault current $I_{fw}$ starts to flow at the time point $t_2$ through the second freewheeling circuit,
wherein current flowing from a first inductor through the first circuit line of the snubber circuit unit becomes zero at a time point b after the time point t2, and
wherein the fault current $I_{fw}$ increases to the time point $t_3$ and then decreases from the time point $t_3$.

8. The circuit breaker of claim 1, wherein the first semiconductor switch is configured such that a first metal-oxide-semiconductor field effect transistor (MOSFET) and a first parallel diode are connected in parallel,
wherein the second semiconductor switch is configured such that a second MOSFET and a second parallel diode are connected in parallel,
wherein the first MOSFET and the second MOSFET are N-channel MOSFETs,
wherein one end and the other end of the first parallel diode are connected to a source and a drain of the first MOSFET, respectively, and
wherein one end and the other end of the second parallel diode are connected to a drain and a source of the second MOSFET, respectively.

9. The circuit breaker of claim 1, wherein the first circuit line is connected in series in the order of the first capacitor and the first diode, and the second circuit line is connected in series in the order of the second diode and the second capacitor.

10. The circuit breaker of claim 1, wherein one end of the third circuit line is connected to another end of the first capacitor and one end of the first diode, and the other end of the third circuit line is connected to one end of the second diode and another end of the second capacitor.

11. The circuit breaker of claim 1, wherein the first resistor and the second resistor are connected to a ground point therebetween, and the snubber circuit unit is point symmetric with respect to the ground point.

12. The circuit breaker of claim 11, wherein the first resistor and the second resistor cause an increase in voltage drop generated when a fault current flows into the snubber circuit unit, and
wherein the ground point, which is a ground path through which the fault current flows, is provided at a connection point between the first resistor and the second resistor.

13. The circuit breaker of claim 1, wherein one end of the first resistor is connected to a connection point between the first capacitor and the first diode, and the other end of the first resistor is connected to a connection point between the second capacitor and the second diode, and
wherein one end of the second resistor is connected in series with the first resistor at the connection point between the second capacitor and the second diode, and the other end of the second resistor is connected to a ground point.

14. The circuit breaker of claim 1, wherein the first resistor and the second resistor are configured as non-linear resistor elements, and are connected in series with each other.

15. The circuit breaker of claim 1, wherein the circuit breaker has a circuit structure in which a mechanical switch is connected in series with the circuit breaker to left and right contacts or one contact, so as to provide physical insulation and overvoltage protection after interruption is completed, and
wherein, the mechanical switch, after the first and second semiconductor switches are turned off, is opened through a separate signal or a time delay to maintain physical insulation of the circuit breaker.

16. The circuit breaker of claim 1, further comprising a metal oxide varistor (MOV) arranged in parallel with the first and second semiconductor switches, so as to suppress an overvoltage, and
wherein the MOV is configured to dump current flowing in the first and second semiconductor switches to another path when a voltage applied to the first and second semiconductor switches is greater than or equal to a predetermined voltage.

* * * * *